United States Patent
Lee et al.

(10) Patent No.: US 9,087,723 B2
(45) Date of Patent: Jul. 21, 2015

(54) FIELD EFFECT TRANSISTOR AND METHOD OF FABRICATING THE SAME

(71) Applicants: Choong-Ho Lee, Yongin-si (KR); Donggu Yi, Seoul (KR); Seung Chul Lee, Seongnam-si (KR); Hyungsuk Lee, Suwon-si (KR); Seonah Nam, Seoul (KR); Changwoo Oh, Suwon-si (KR); Jongwook Lee, Yongin-si (KR); Song-Yi Han, Hwaseong-si (KR)

(72) Inventors: Choong-Ho Lee, Yongin-si (KR); Donggu Yi, Seoul (KR); Seung Chul Lee, Seongnam-si (KR); Hyungsuk Lee, Suwon-si (KR); Seonah Nam, Seoul (KR); Changwoo Oh, Suwon-si (KR); Jongwook Lee, Yongin-si (KR); Song-Yi Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 73 days.

(21) Appl. No.: 13/754,063

(22) Filed: Jan. 30, 2013

(65) Prior Publication Data

US 2013/0221447 A1    Aug. 29, 2013

(30) Foreign Application Priority Data

Feb. 27, 2012    (KR) .................. 10-2012-0019765

(51) Int. Cl.
| | |
|---|---|
| *H01L 21/70* | (2006.01) |
| *H01L 27/092* | (2006.01) |
| *H01L 29/66* | (2006.01) |
| *H01L 29/51* | (2006.01) |
| *H01L 29/78* | (2006.01) |

(52) U.S. Cl.
CPC ............ *H01L 27/092* (2013.01); *H01L 29/517* (2013.01); *H01L 29/66545* (2013.01); *H01L 29/66795* (2013.01); *H01L 29/785* (2013.01); *H01L 29/7848* (2013.01)

(58) Field of Classification Search
CPC ........................................................ H01L 27/092
USPC ........................................................ 257/369, 27
See application file for complete search history.

(56) References Cited

U.S. PATENT DOCUMENTS

| | | | |
|---|---|---|---|
| 6,413,802 B1 | 7/2002 | Hu et al. | |
| 7,915,693 B2 | 3/2011 | Okano | |
| 8,722,494 B1 * | 5/2014 | Basker et al. | ................. 438/283 |

(Continued)

FOREIGN PATENT DOCUMENTS

| | | |
|---|---|---|
| KR | 10-2007-0002739 | 1/2007 |
| KR | 10-2009-0041869 | 4/2009 |

OTHER PUBLICATIONS

C. H. Lee et al., "Novel Body Tied FinFET Cell Array Transistor DRAM with Negative Word Line Operation for sub 60nm Technology and beyond", 2004 Symposium on VLSI Technology Digest of Technical Papers.

*Primary Examiner* — Matthew Landau
*Assistant Examiner* — Igwe U Anya
(74) *Attorney, Agent, or Firm* — Onello & Mello, LLP.

(57) ABSTRACT

Provided are field effect transistors and methods of fabricating the same. The transistor may include a substrate with an active pattern, the active pattern having a top surface and two sidewalls, a gate electrode proximal to the top surface and the sidewalls of the active pattern and crossing the active pattern, a gate spacer covering a sidewall of the gate electrode, a gate dielectric pattern at a bottom surface of the gate electrode, a source electrode on the active pattern at one side of the gate electrode, a drain electrode on the active pattern at another side of the gate electrode, and silicide patterns on surfaces of the source and drain electrodes, respectively. The gate dielectric pattern includes at least one high-k layer and the gate spacer has a dielectric constant that is smaller than that of the gate dielectric pattern.

16 Claims, 31 Drawing Sheets

(56) References Cited

U.S. PATENT DOCUMENTS

| | | | |
|---|---|---|---|
| 2005/0156171 A1* | 7/2005 | Brask et al. | 257/72 |
| 2006/0175669 A1 | 8/2006 | Kim et al. | |
| 2006/0270156 A1* | 11/2006 | Kim et al. | 438/257 |
| 2007/0066001 A1* | 3/2007 | Iinuma | 438/199 |
| 2007/0102763 A1* | 5/2007 | Yeo et al. | 257/353 |
| 2007/0134878 A1* | 6/2007 | Brask et al. | 438/294 |
| 2010/0207209 A1 | 8/2010 | Inokuma | |
| 2010/0276761 A1* | 11/2010 | Tung et al. | 257/384 |
| 2011/0079829 A1 | 4/2011 | Lai et al. | |
| 2011/0101455 A1 | 5/2011 | Basker et al. | |
| 2011/0147842 A1 | 6/2011 | Cappellani et al. | |
| 2011/0169101 A1 | 7/2011 | Doornbos et al. | |
| 2011/0175163 A1 | 7/2011 | Cartier et al. | |
| 2011/0175165 A1 | 7/2011 | Yu et al. | |
| 2011/0182098 A1 | 7/2011 | Liaw | |
| 2011/0183485 A1 | 7/2011 | Tateshita | |
| 2011/0183508 A1 | 7/2011 | Chan et al. | |
| 2012/0001197 A1* | 1/2012 | Liaw et al. | 257/77 |
| 2012/0012932 A1* | 1/2012 | Perng et al. | 257/347 |
| 2013/0126985 A1* | 5/2013 | Cheng et al. | 257/411 |
| 2013/0175584 A1* | 7/2013 | Ho et al. | 257/288 |

* cited by examiner

FIELD EFFECT TRANSISTOR AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2012-0019765, filed on Feb. 27, 2012, in the Korean Intellectual Property Office, the entire contents of which are hereby incorporated by reference.

BACKGROUND

Embodiments of the inventive concepts relate to a semiconductor device, and more particularly, to a field effect transistor and a method of fabricating the same.

As a consequence of the high integration of modern semiconductor devices, it is becoming harder to improve transistor performance. To overcome these technical difficulties, a variety of field effect transistor (FET) structures have been introduced. In particular, these FET structures include a high-k metal gate structure. Here, a silicon oxide layer and a polysilicon layer are used to form a gate insulating layer and a gate electrode.

SUMMARY

Embodiments of the inventive concepts provide high-k metal gate Fin-FETs with a reduced source-drain resistance. Example embodiments of the inventive concepts provide high-k metal gate Fin-FETs configured to suppress gate electrode resistance from increasing. Other example embodiments of the inventive concepts provide high-k metal gate Fin-FETs configured to reduce a capacitive coupling. Other example embodiments of the inventive concepts provide a fabricating method capable of reducing source-drain resistance of a high-k metal gate Fin-FET. Other example embodiments of the inventive concepts provide a fabricating method capable of reducing gate electrode resistance of a high-k metal gate Fin-FET. Other example embodiments of the inventive concepts provide a fabricating method capable of reducing a capacitive coupling in a high-k metal gate Fin-FET.

According to embodiments of the inventive concepts, a field effect transistor includes a substrate with an active pattern having a top surface and two sidewalls, a gate electrode proximal to the top surface and the sidewalls of the active pattern and crossing the active pattern, a gate spacer covering a sidewall of the gate electrode, a gate dielectric pattern at a bottom surface of the gate electrode, a source electrode on the active pattern at one side of the gate electrode, a drain electrode on the active pattern at another side of the gate electrode, and silicide patterns on surfaces of the source and drain electrodes, respectively. The gate dielectric pattern includes at least one high-k layer and the gate spacer has a dielectric constant that is smaller than that of the gate dielectric pattern.

In an embodiment, the active pattern comprises a channel region between the source and drain electrodes and below the gate electrode, and the gate electrode comprises first portions facing both sidewalls of the channel region and a second portion provided on the channel region to connect the first portions with each other.

In an embodiment, the first portions are thicker than the second portion.

In an embodiment, the gate dielectric pattern is below the gate electrode and covers a bottom and side surfaces of the first portions and a bottom surface of the second portion, respectively.

In an embodiment, the substrate comprises an NMOS region and a PMOS region, and the source and drain electrodes are configured to apply a tensile strain to a portion of the channel region in the NMOS region and to apply a compressive strain to a portion of the channel region in the PMOS region.

In an embodiment, the source and drain electrodes include a different material than the substrate.

In an embodiment, top surfaces of the source and drain electrodes are higher than the bottom surface of the gate electrode adjacent the source and drain electrodes, and wherein opposite side surfaces of the source and drain electrodes and the gate electrode are spaced apart from each other by a substantially uniform distance.

In an embodiment, the gate spacer fills a space between the opposite side surfaces of the source and drain electrodes and the gate electrode.

In an embodiment, the gate dielectric pattern is below the bottom surface of the gate electrode and has a substantially same width as a width of the gate electrode.

In an embodiment, the gate electrode comprises a first gate electrode and a second gate electrode, wherein the first gate electrode covers a top surface of the gate dielectric pattern and an inner sidewall of the gate spacer conformally, and wherein the second gate electrode fills a space delimited by an inner sidewall of the first gate electrode.

In an embodiment, a material interposed between the gate electrode and at least one of the source and drain electrodes has a dielectric constant that is smaller than or equivalent to a dielectric constant of a silicon nitride layer.

Other embodiments of the present inventive concepts include a method of fabricating a field effect transistor. The method includes patterning a substrate to form an active fin; forming a gate insulating layer to cover the active fin; forming a sacrificial gate pattern on the gate insulating layer to cross the active fin; forming a gate spacer on a sidewall of the sacrificial gate pattern; forming a source electrode at on side of the sacrificial gate pattern; forming a drain electrode at another side of the sacrificial gate pattern; forming silicide patterns on the source and drain electrodes, respectively; and replacing the sacrificial gate pattern with a gate pattern.

In an embodiment, the gate insulating layer is formed of at least one high-k dielectric, and method further comprises performing a thermal treatment after forming the gate insulating layer and before forming the silicide pattern.

In an embodiment, the silicide pattern is formed of at least one of nickel silicide, cobalt silicide, tungsten silicide, titanium silicide, niobium silicide, or tantalum silicide.

In an embodiment, the gate insulating layer remains after replacing the sacrificial gate pattern with the gate pattern, thereby being at least a portion of a gate dielectric of the field effect transistor.

In an embodiment, the gate spacer has a dielectric constant smaller than the gate insulating layer.

In an embodiment, the active fin comprises a channel region below the sacrificial gate pattern and source and drain regions at both sides of the channel region, and forming the sacrificial gate pattern further comprises etching the gate insulating layer to expose the source and drain regions of the active fin.

In an embodiment, forming the sacrificial gate pattern further comprises etching the exposed source and drain regions to transform the source and drain regions of the active fin into a tapered structure whose width decreases upward.

In an embodiment, forming the active fin comprises forming a channel region below the sacrificial gate pattern and the source and drain regions, and forming the gate spacer comprises exposing the source and drain regions of the active fin.

In an embodiment, forming the active fin comprises: patterning the substrate to form device isolation trenches; forming a device isolation layer to fill the device isolation trenches; and recessing a top surface of the device isolation layer to form device isolation patterns having top surfaces lower than that of the substrate.

In an embodiment, the gate insulating layer is formed to have a single- or multi-layered structure.

In an embodiment, the substrate comprises an NMOS region and a PMOS region, and forming of the source/drain electrodes comprises: forming an epitaxial layer having a tensile strain property in the NMOS region; and forming an epitaxial layer having a compressive strain property in the PMOS region.

In an embodiment, replacing of sacrificial gate pattern with the gate pattern comprises: removing the sacrificial gate pattern to expose the gate insulating layer; and forming a gate layer on the exposed gate insulating layer, wherein removing the sacrificial gate pattern is performed using an etch recipe having an etch selectivity with respect to the gate insulating layer and the gate spacer.

In an embodiment, forming the gate layer comprises: forming a work-function controlling layer on the exposed gate insulating layer; and forming a metal layer on the work-function controlling layer.

In an embodiment, the sacrificial gate pattern comprises a lower sacrificial pattern conformally covering the gate insulating layer and an upper sacrificial pattern formed on the lower sacrificial pattern, and replacing of sacrificial gate pattern with the gate pattern comprises: selectively removing the upper sacrificial pattern using the lower sacrificial pattern as an etch stop layer; and selectively removing the lower sacrificial pattern using an etch recipe having etch selectivity with respect to the gate insulating layer.

Other embodiments of the present inventive concepts include field effect transistor, comprising a substrate with an active pattern. The active pattern has a top surface and two sidewalls. A gate electrode is on the top surface and the sidewalls of the active pattern. A source electrode is on the active pattern at one side of the gate electrode. A drain electrode is on the active pattern at another side of the gate electrode. An insulating material is between an inner sidewall of the gate electrode and at least one of the source electrode and the drain electrode. A high-k gate dielectric pattern is at a bottom surface of the gate electrode, wherein the insulating material has a dielectric constant that is smaller than that of the gate dielectric pattern.

In an embodiment, the active pattern comprises a channel region between the source and drain electrodes and below the gate electrode, and wherein the gate electrode comprises first portions facing both sidewalls of the channel region and a second portion provided on the channel region to connect the first portions with each other.

In an embodiment, the substrate comprises an NMOS region and a PMOS region, and the source and drain electrodes are configured to apply a tensile strain to a portion of the channel region in the NMOS region and to apply a compressive strain to a portion of the channel region in the PMOS region.

In an embodiment, top surfaces of the source and drain electrodes are higher than the bottom surface of the gate electrode adjacent the source and drain electrodes, and opposite side surfaces of the source and drain electrodes and the gate electrode are spaced apart from each other by a substantially uniform distance.

In an embodiment, the gate dielectric pattern has a substantially same width as a width of the gate electrode.

In an embodiment, the gate electrode comprises a first gate electrode and a second gate electrode, wherein the first gate electrode covers a top surface of the gate insulating pattern and an inner sidewall of the gate spacer conformally, and wherein the second gate electrode fills a space delimited by an inner sidewall of the first gate electrode.

In an embodiment, the insulating material has a dielectric constant that is smaller than or equivalent to a dielectric constant of a silicon nitride layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 2A through 12A are perspective views illustrating a method of fabricating a semiconductor device according to embodiments of the inventive concepts.

FIGS. 2B through 12B are sectional views of the semiconductor device taken along lines I-I' and II-II' of FIGS. 2A through 12A, respectively.

Figure 1:
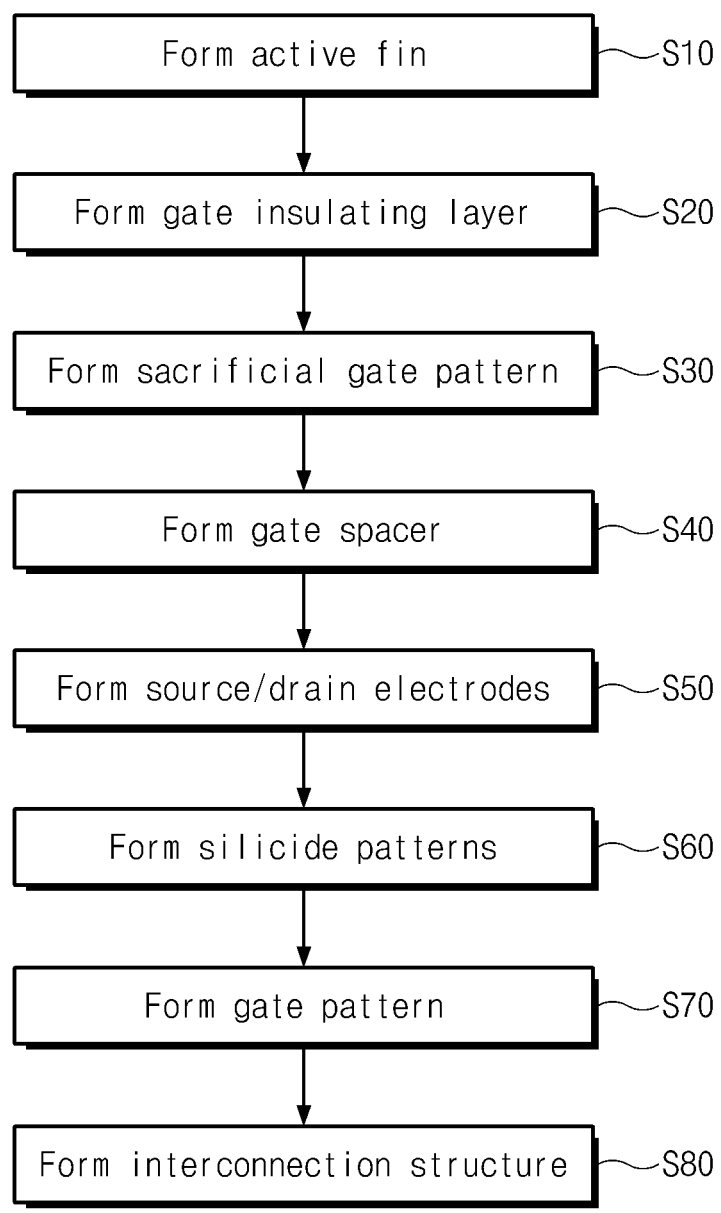
FIG. 1 is a flow chart illustrating a method of fabricating a semiconductor device according to embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings. Embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Embodiments of the present inventive concepts include high-k/metal gate Fin-FETs having silicide patterns provided on their source and/or drain regions. A high-k gate insulating layer is formed prior to the formation of the silicon pattern, thereby reducing a risk of thermal damage to the silicide pattern when a thermal treatment is performed to stabilize electric and structural characteristics of the high-k gate insulating layer. The localization of the high-k gate insulating layer in this manner can overcome other technical issues related to an increase in a capacitive coupling, a reduction in an effective sectional area of the gate electrode, and so on.

FIG. 1 is a flow chart illustrating a method of fabricating a semiconductor device according to example embodiments of the inventive concepts. FIGS. 2A through 12A are perspective views illustrating a method of fabricating a semiconductor device according to example embodiments of the inventive concepts. FIGS. 2B through 12B are sectional views of the semiconductor device taken along lines I-I' and II-II' of FIGS. 2A through 12A, respectively.

Figure 2A:
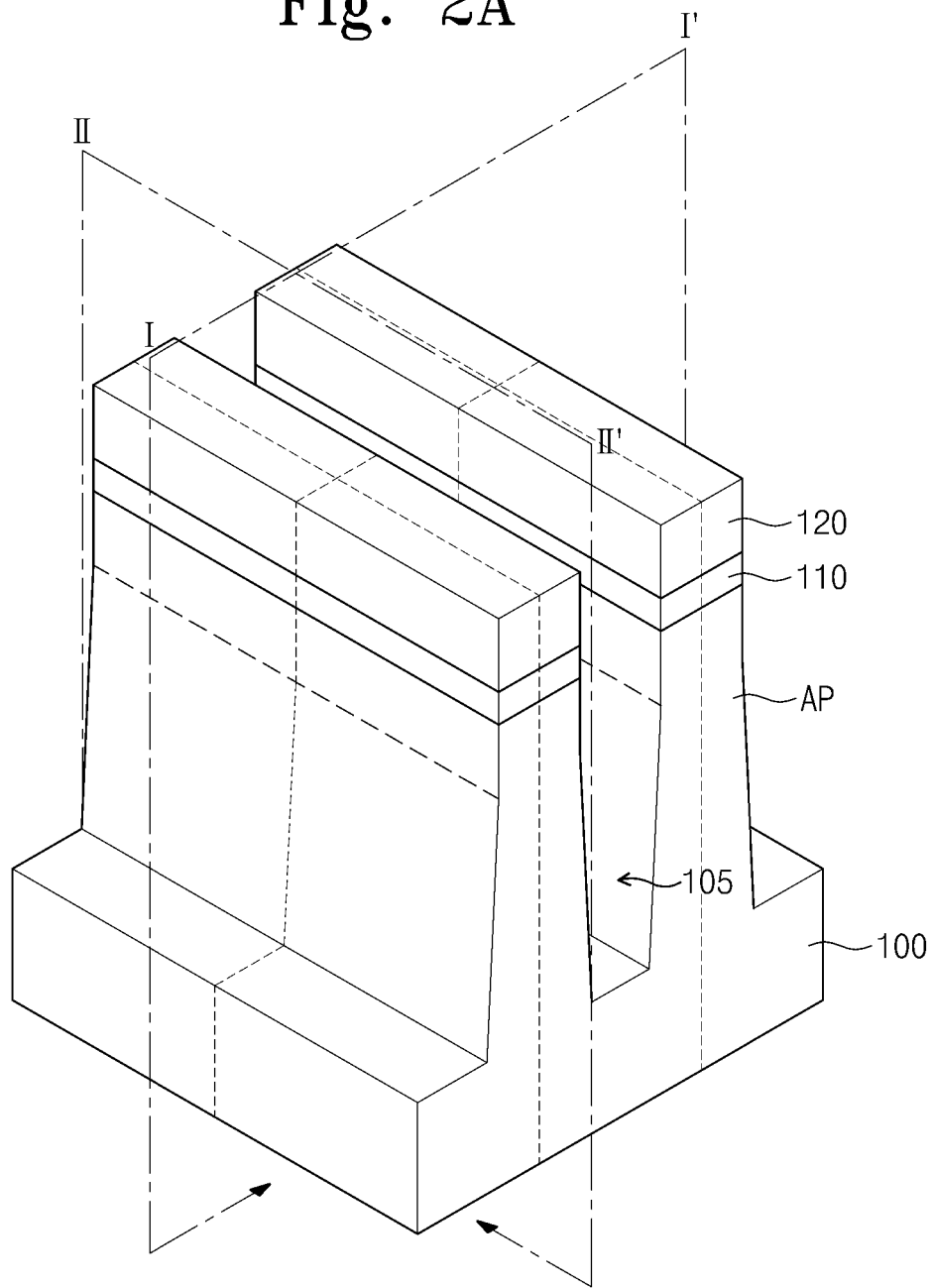
Figure 2B:
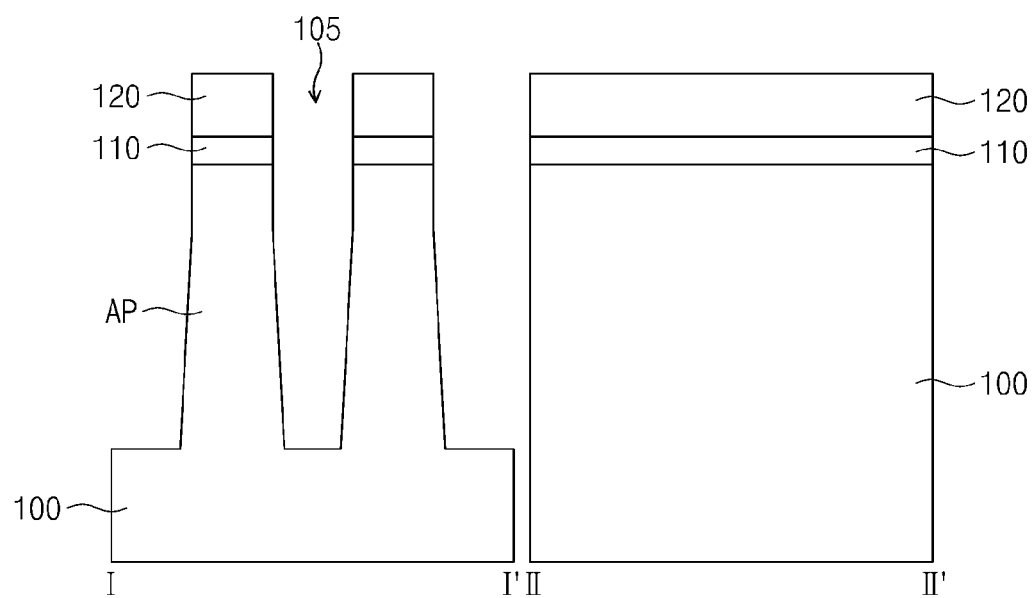

Referring to FIGS. 1, 2A, and 2B, a substrate 100 may be patterned to form device isolation trenches 105 defining active patterns AP (S10). The substrate 100 may be provided in a form of a bulk silicon wafer or a SOI wafer. For the sake of simplicity, the description that follows will refer to an example of the present embodiments in which the substrate 100 is a bulk silicon wafer. However, the example embodiments of the inventive concepts are not limited to those described herein.

The formation of the device isolation trenches 105 may include forming one or more mask patterns 110, 120 on the substrate 100 and anisotropically etching the substrate 100 using the mask patterns as an etch mask. In example embodiments, the mask patterns may include a first mask pattern 110 and a second mask pattern 120, which may have different etch selectivity from each other and be stacked on one another. Each of the device isolation trenches 105 may be formed to have an aspect ratio of at least 5. In some embodiments, each of the device isolation trenches 105 has a downward tapered shape. As a result, each of the active patterns AP may have an upward tapered shape.

Figure 3A:
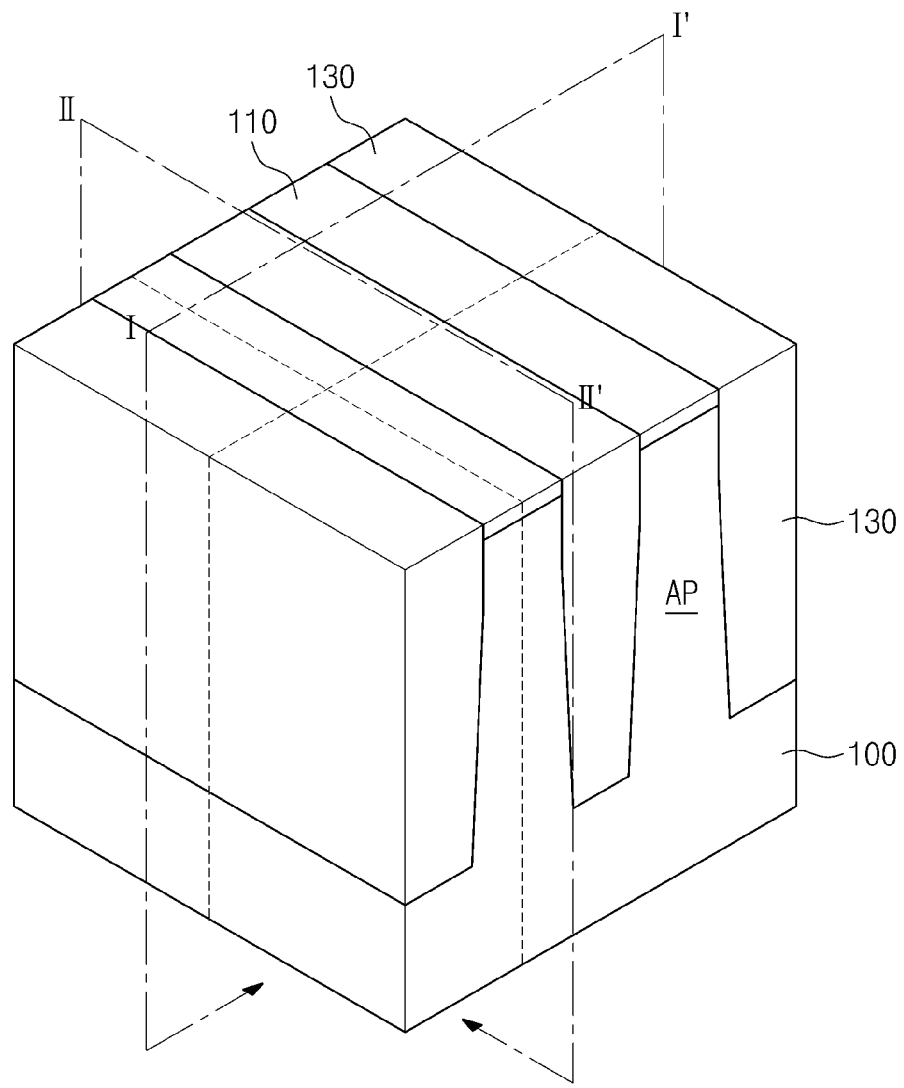
Figure 3B:
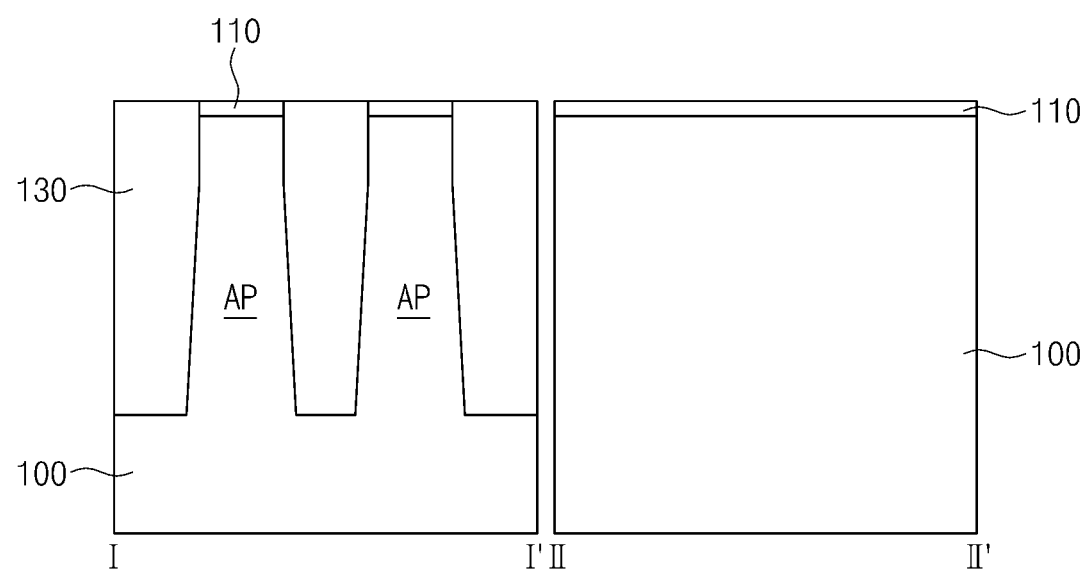

Referring to FIGS. 3A and 3B, one or more device isolation patterns 130 may be formed to fill the device isolation trenches 105. The device isolation patterns 130 may be formed by forming a device isolation layer that at least fills the device isolation trenches 105, then planarizing the device isolation layer. The second mask pattern 120 may be removed to expose a top surface of the first mask pattern 110. Accordingly, the device isolation patterns 130 may be localized at the device isolation trenches 105.

Figure 4A:
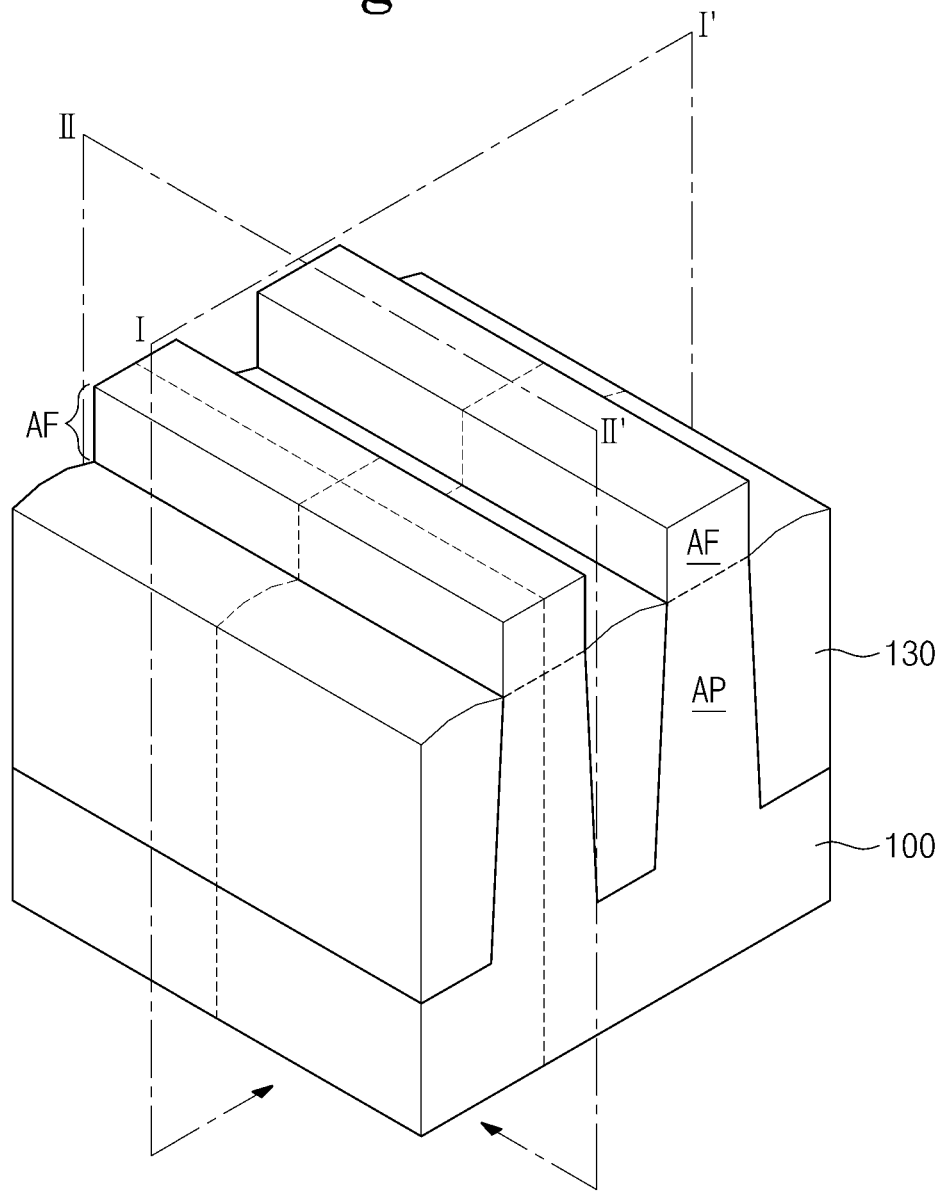
Figure 4B:
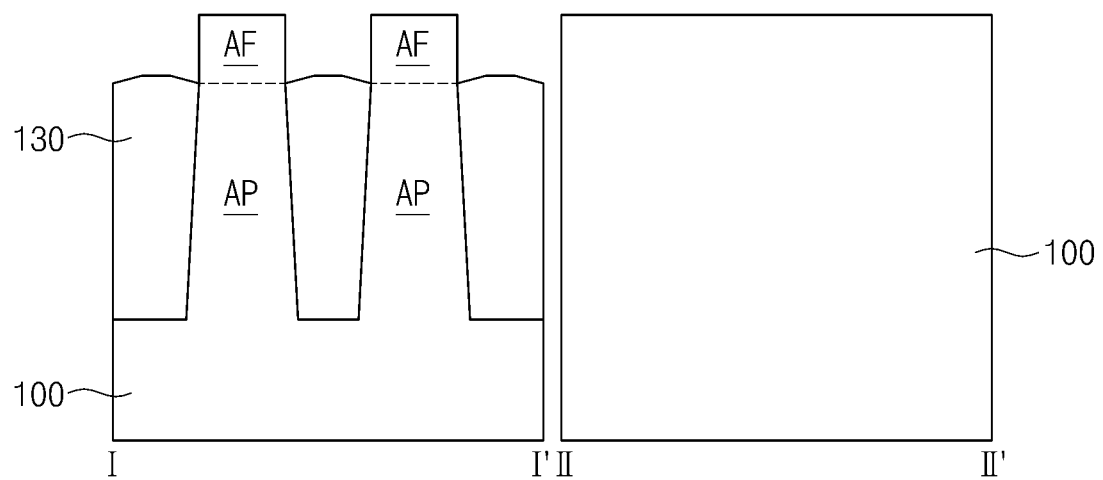

Referring to FIGS. 4A and 4B, upper regions, hereinafter, active fins AF, of the active patterns AP may be exposed. The active fins AF may extend from the device isolation patterns 130 by recessing top surfaces of the device isolation patterns 130 using a wet etching process. The etching of the device isolation patterns 130 may be performed using an etch recipe having an etch selectivity with respect to the active pattern AP.

During the etching of the device isolation patterns 130, the first mask pattern 110 may be removed to expose the top surfaces of the active fins AF, as shown. In other embodiments where the first and second mask patterns 110, 120 are on the active patterns AP, for example, where the second mask pattern 120 is not removed at FIGS. 3A and 3B, the first and second mask patterns 110, 120 may be removed to expose the top surfaces of the active fins AF.

Figure 5A:
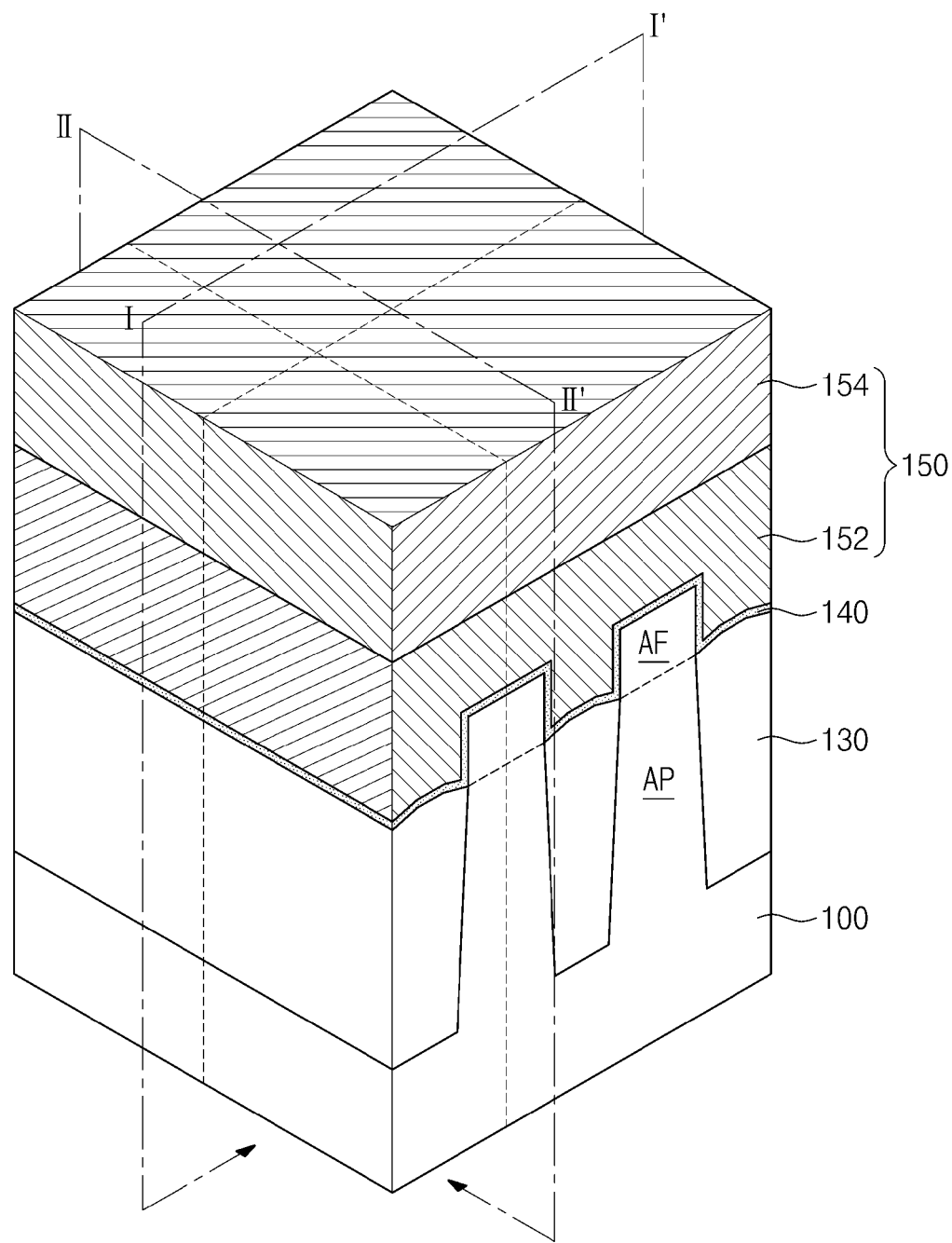
Figure 5B:
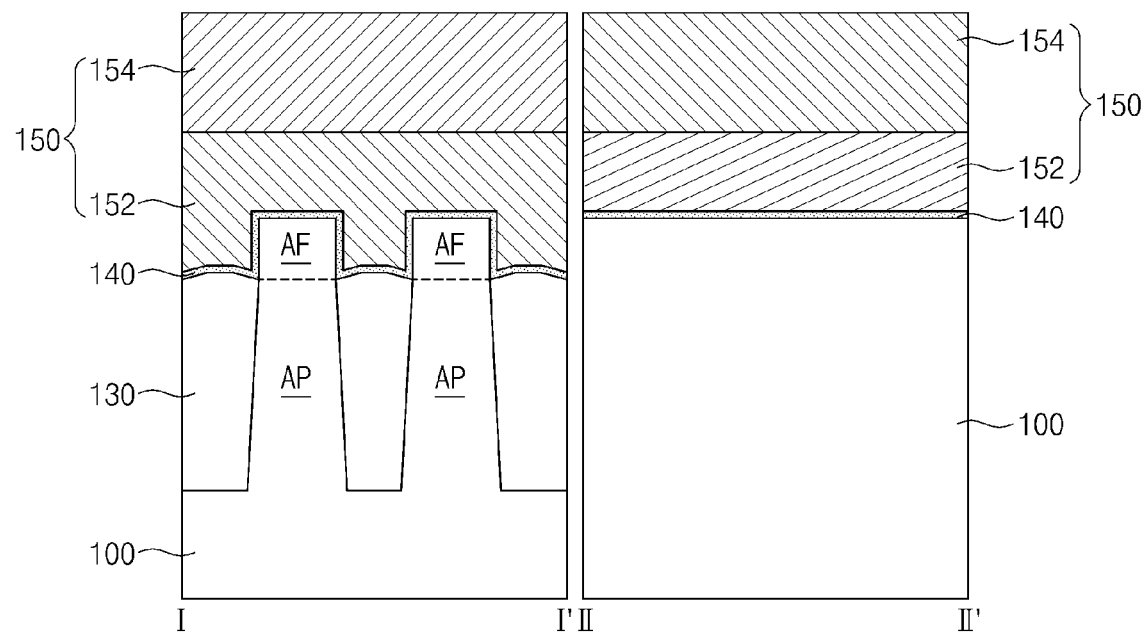

Referring to FIGS. 1, 5A, and 5B, a gate insulating layer 140 may be formed to cover the active fins AF (S20). A sacrificial gate layer 150 may be formed on the gate insulating layer 140.

The gate insulating layer 140 may include at least one of high-k dielectric materials. The gate insulating layer 140 may be formed of, but not be limited to, at least one of hafnium oxide, hafnium silicate, zirconium oxide, or zirconium silicate.

In some embodiments, the formation of the gate insulating layer 140 may include depositing a high-k dielectric using, for example, an atomic layer deposition (ALD) technique and thermally treating the deposited high-k dielectric. However, embodiments of the inventive concepts are not limited to the thermal treatment being performed directly after the deposition of the gate insulating layer 140. In other embodiments, the thermal treatment may be, for example, performed between the step of depositing the high-k dielectric and a step of forming a silicide pattern 190, described herein with reference to FIGS. 9A and 9B.

Electrical and/or structural properties of the gate insulating layer 140 may be improved by a thermal treatment. For example, a thermal treatment may be performed at a temperature that is higher than a minimum temperature required for improving the electrical and/or structural properties of the gate insulating layer 140. Furthermore, in some embodiments, the temperature of the thermal treatment may be higher than a minimum temperature determined to possibly cause thermal damage to the silicide pattern 190, for example, about 450 Celsius degrees for nickel silicide and about 850 Celsius degrees for titanium silicide. Accordingly, since the silicide pattern 190 is formed after the thermal treatment, the silicon pattern 190 is not exposed to the risk of damage that may otherwise be caused by the thermal treatment. Furthermore, even if the thermal treatment is performed after the deposition of the high-k dielectric, since the substrate 100, the device isolation pattern 130, and the gate insulating layer 140 may be formed of refractory materials, they can likewise be free from thermal damage.

The sacrificial gate layer 150 may include at least one layer having a etch selectivity with respect to the gate insulating layer 140. In some embodiments, for example, shown at FIGS. 5A and 5B, the sacrificial gate layer 150 may include a first sacrificial layer 152 and a second sacrificial layer 154 sequentially stacked on the gate insulating layer 140.

Figure 6A:
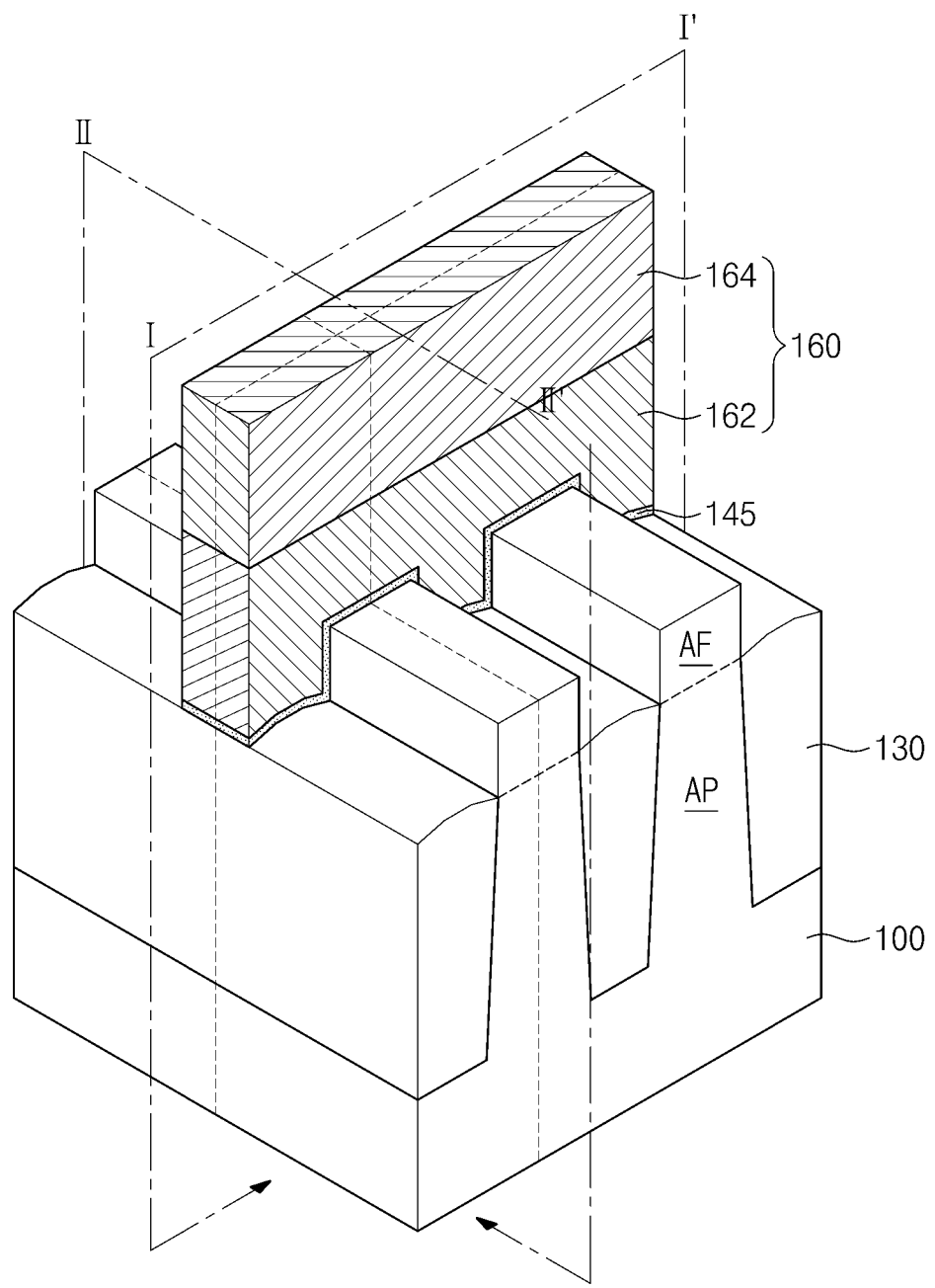
Figure 6B:
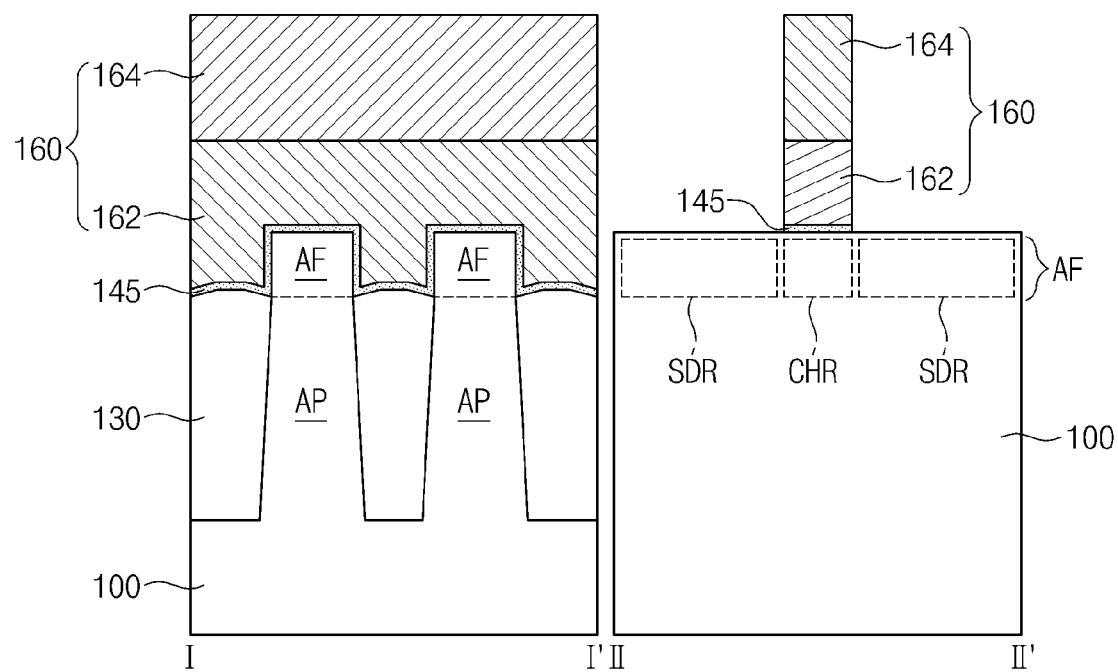

Referring to FIGS. 1, 6A, and 6B, the sacrificial gate layer 150 may be patterned to form a sacrificial gate pattern 160 (S30).

The sacrificial gate pattern 160 may be formed to cross the active fins AF. Accordingly, as shown in FIG. 6B, a channel region CHR and source/drain regions SDR may be defined in each of the active fins AF. Here, the channel region CHR may be formed at a portion of the active fin AF positioned below the sacrificial gate pattern 160, while the source/drain regions SDR may be formed at other portions of the active fin AF, and positioned at both sides of the sacrificial gate pattern 160 and horizontally separated from each other by the channel region CHR.

The formation of the sacrificial gate pattern 160 may be performed to expose portions, e.g., the source/drain regions SDR, of the active fin AF, which may be positioned at both sides of the sacrificial gate pattern 160. For example, the formation of the sacrificial gate pattern 160 may include anisotropically etching the sacrificial gate layer 150 using the gate insulating layer 140 as an etch stop layer and etching the gate insulating layer 140 to expose the source/drain regions SDR. In example embodiments, the gate insulating layer 140 may be etched using an isotropic etching technique. Accordingly, a gate insulating pattern 145, or gate dielectric pattern, may be locally formed beneath the sacrificial gate pattern 160.

Figure 7A:
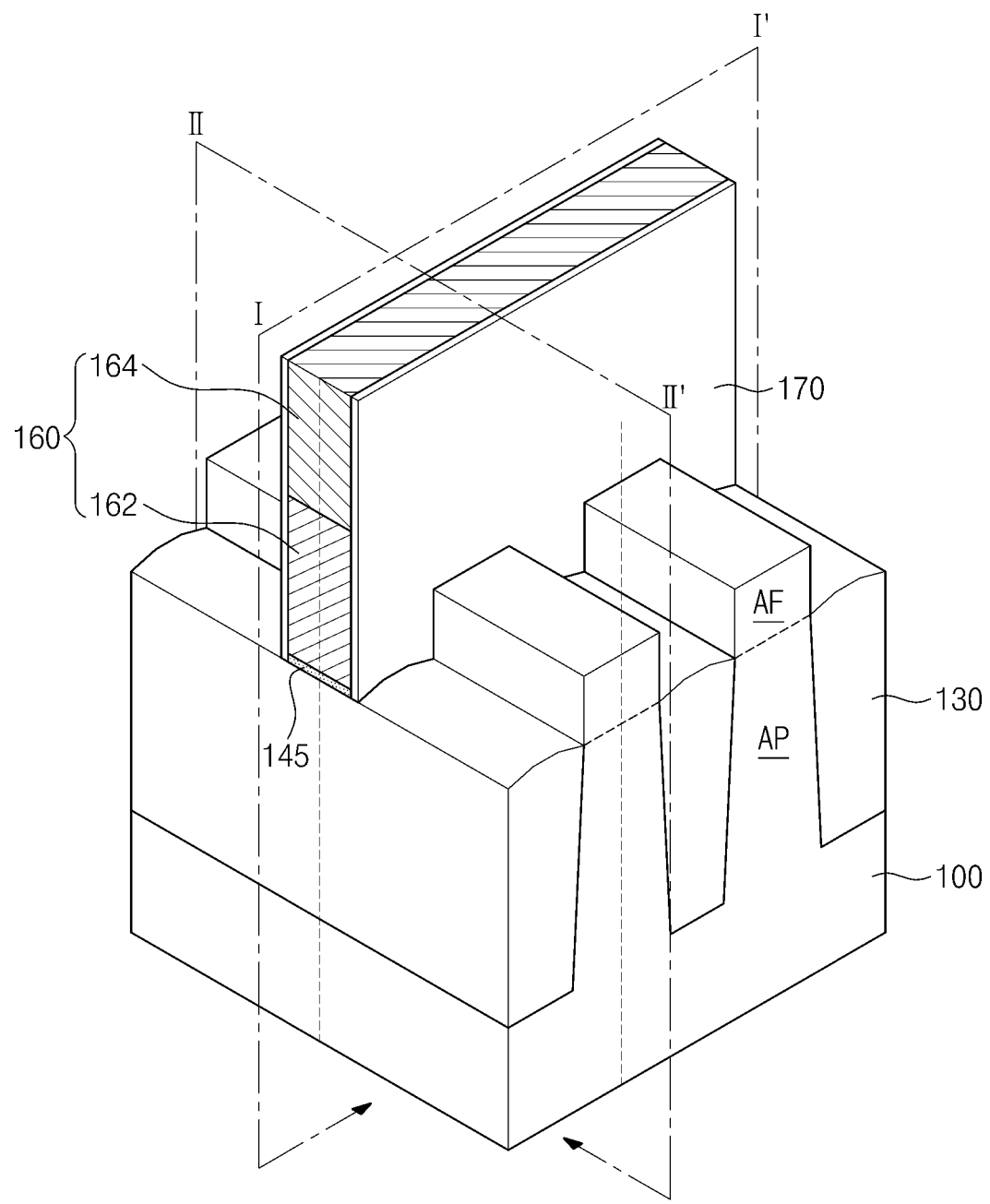
Figure 7B:
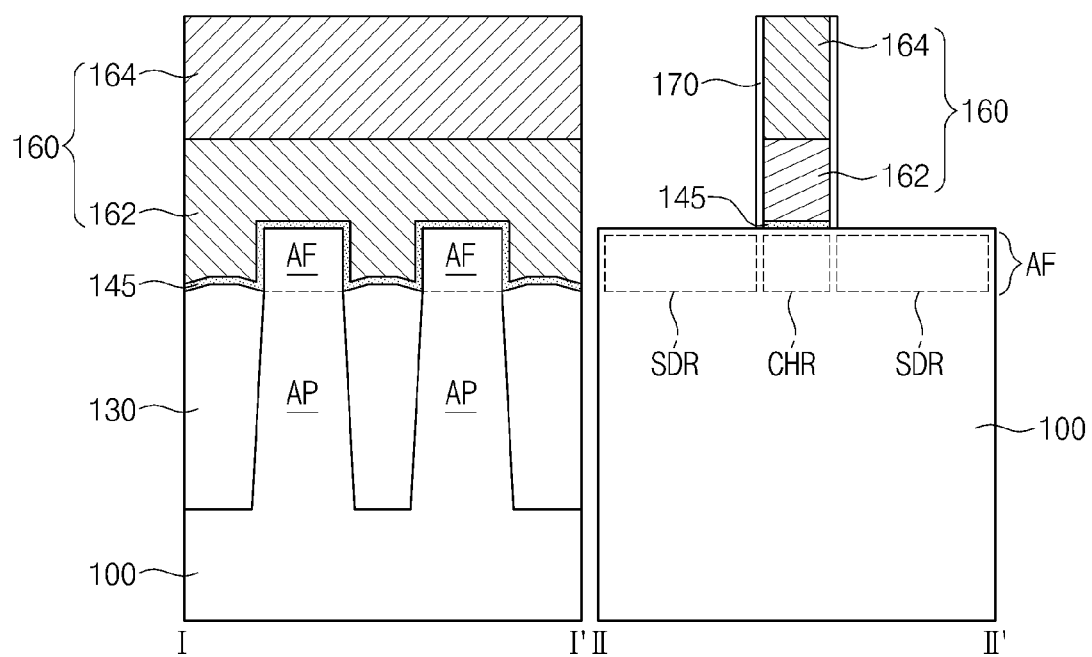

Referring to FIGS. 1, 7A, and 7B, gate spacers 170 may be formed at the sidewalls of the sacrificial gate pattern 160 (S40). The formation of the gate spacers 170 may include forming a gate spacer layer on the structure provided with the sacrificial gate pattern 160, and then, etching the gate spacer layer to expose top surfaces of the device isolation patterns 130.

The gate spacer layer may be etched to expose the source/drain regions SDR. For example, top surfaces of the source/drain regions SDR may be exposed from the etching of the gate spacer layer. Furthermore, in some embodiments, both sidewalls of the source/drain regions SDR may be exposed from the etching of the gate spacer layer.

Figure 13:
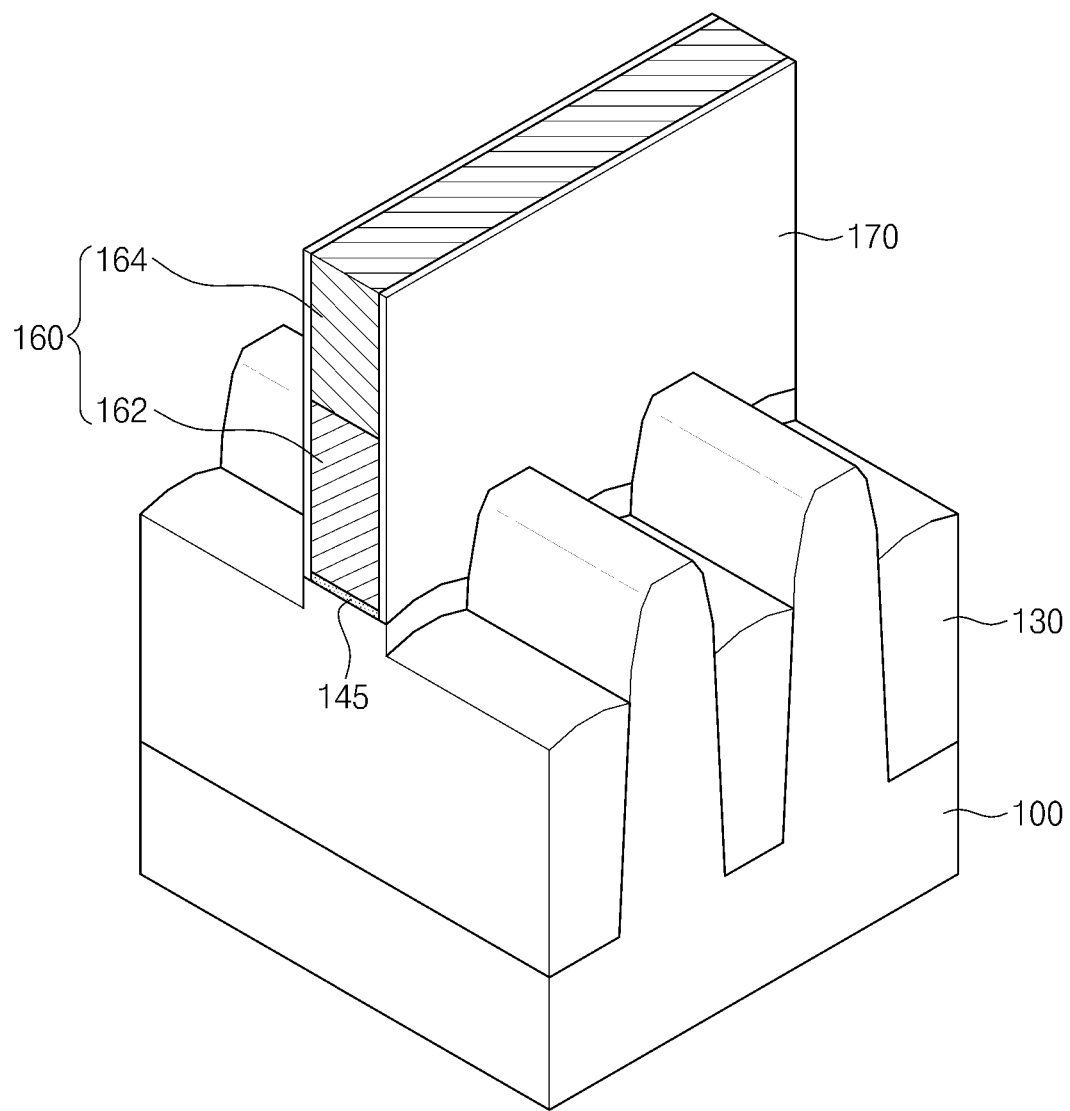
FIG. 13 is a perspective view illustrating a method of fabricating a semiconductor device according to embodiments of the inventive concepts.

For example, the exposed surfaces of the source/drain regions SDR may be additionally etched during the formation of the sacrificial gate pattern 160 described with reference to FIG. 6A. As a result, upper edges of the source/drain regions SDR may be etched. In this manner, the source/drain region SDR may have a tapered structure, for example, having a width that decreases from a bottom region to a top region of the source/drain region SDR, for example, as shown in FIG. 13. Due to the tapered structure of the source/drain region SDR, it is possible to remove the gate spacer layer from the sidewalls of the source/drain regions SDR so that the gate spacers 170 remain on a sidewall of the sacrificial gate pattern 160.

Figure 8A:
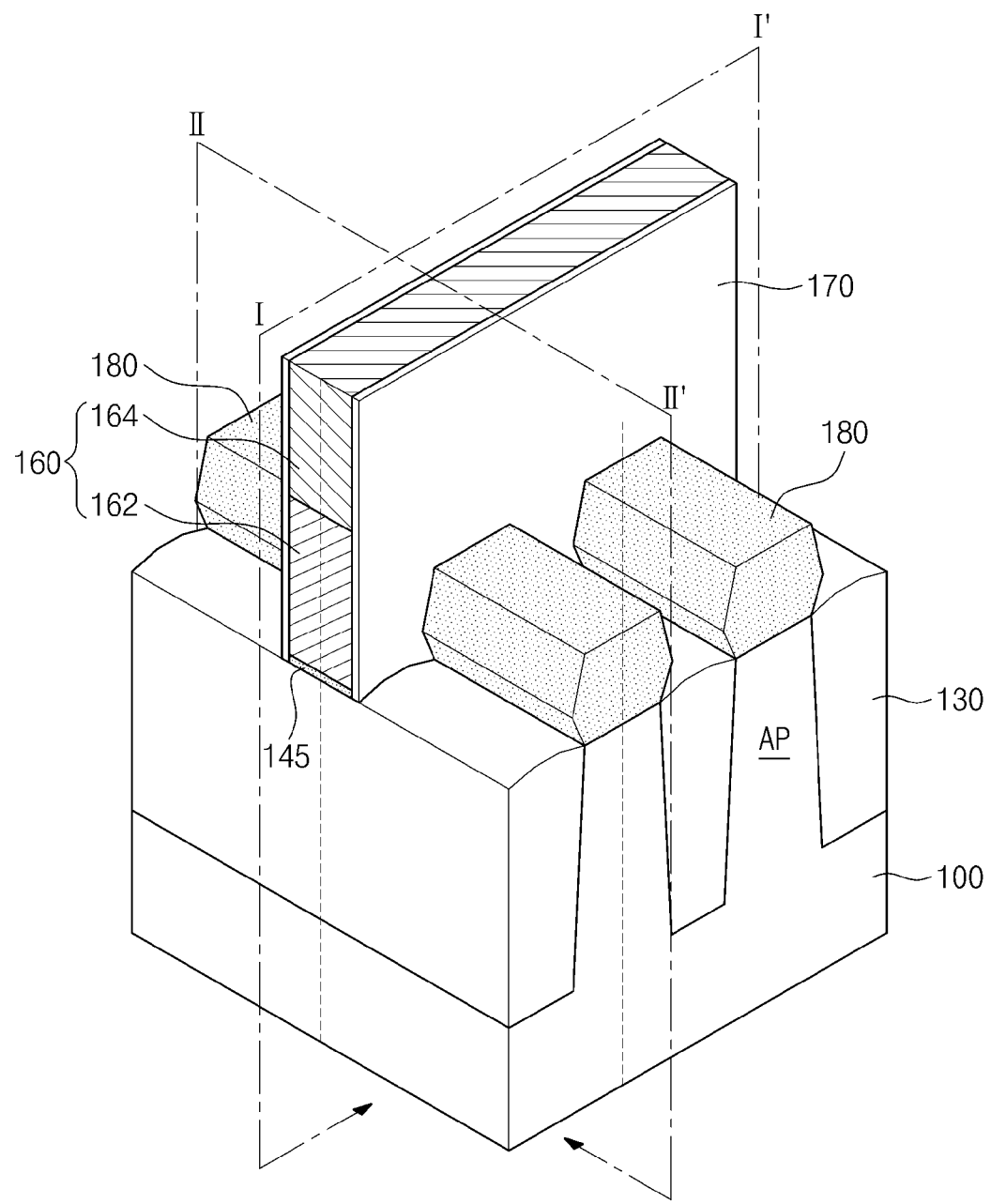
Figure 8B:
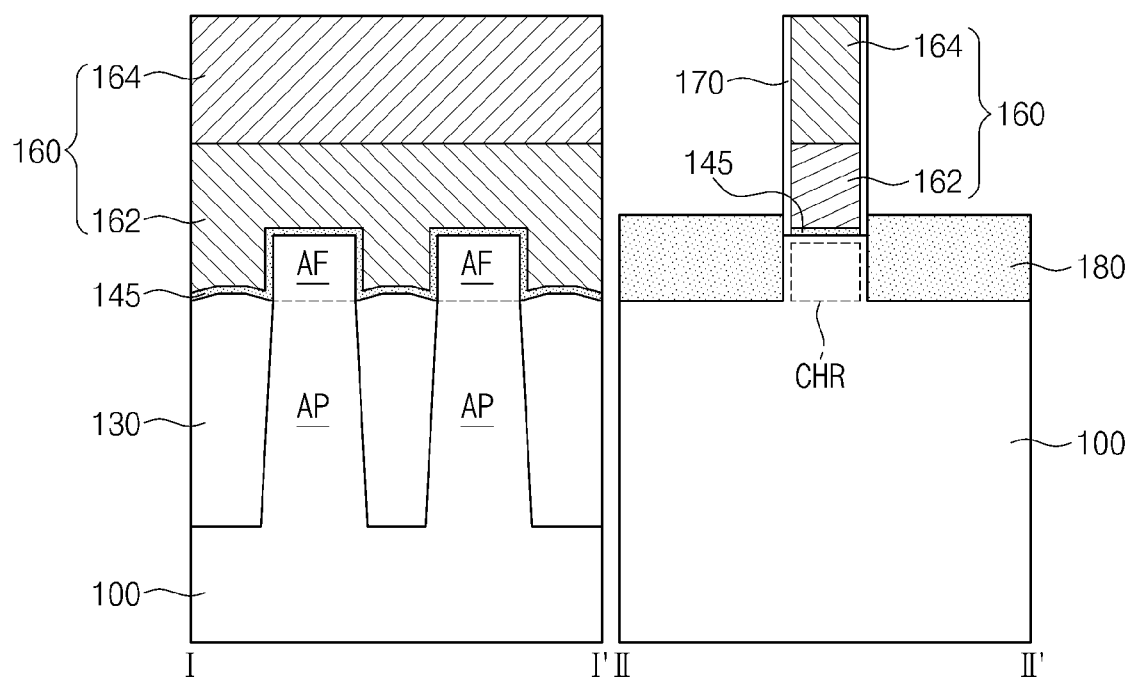

Referring to FIGS. 1, 8A, and 8B, source/drain electrodes 180 may be formed at sides of the sacrificial gate pattern 160 (S50). The source/drain electrodes 180 may be formed at the source/drain regions SDR of the active fin AF. Accordingly, the channel region CHR of the active fin AF may be positioned between the source/drain electrodes 180.

The formation of the source/drain electrodes 180 may include removing the source/drain regions SDR and forming an epitaxial layer. In embodiments in which the semiconductor device is provided to realize a CMOS device, the formation of the epitaxial layer may include forming a first epitaxial layer serving as N-type metal-oxide-semiconductor (NMOS) FET source/drain electrodes and forming a second epitaxial layer serving as P-type metal-oxide-semiconductor (PMOS) FET source/drain electrodes. In example embodiments, the first epitaxial layer may be configured to apply a tensile strain to the channel region CHR, and the second epitaxial layer may be configured to apply a compressive strain to the channel region CHR. For example, the first epitaxial layer may be formed of silicon carbide (SiC) and the second epitaxial layer may be formed of silicon germanium (SiGe). This example embodiment of the inventive concepts is not limited thereto.

Figure 9A:
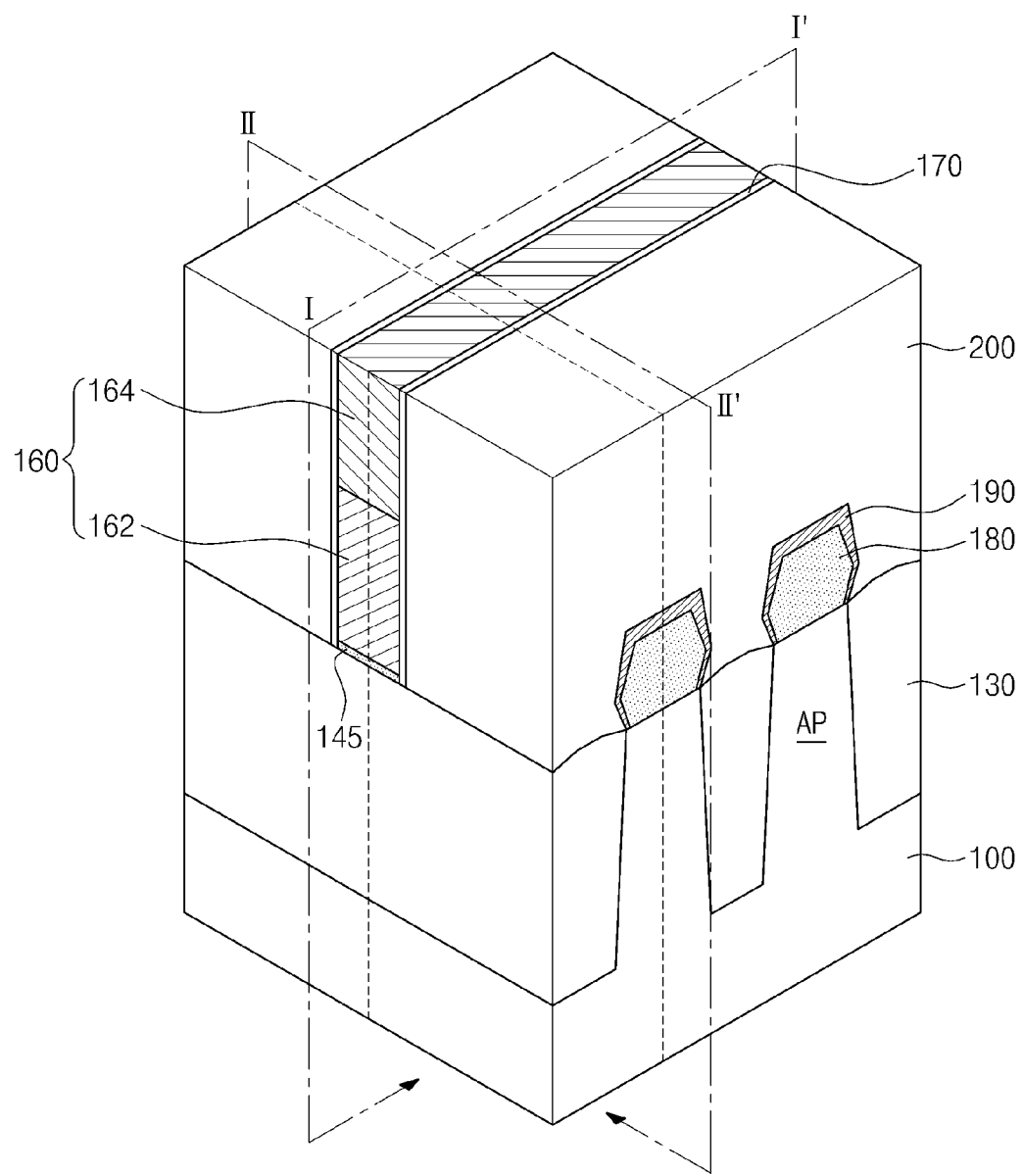
Figure 9B:
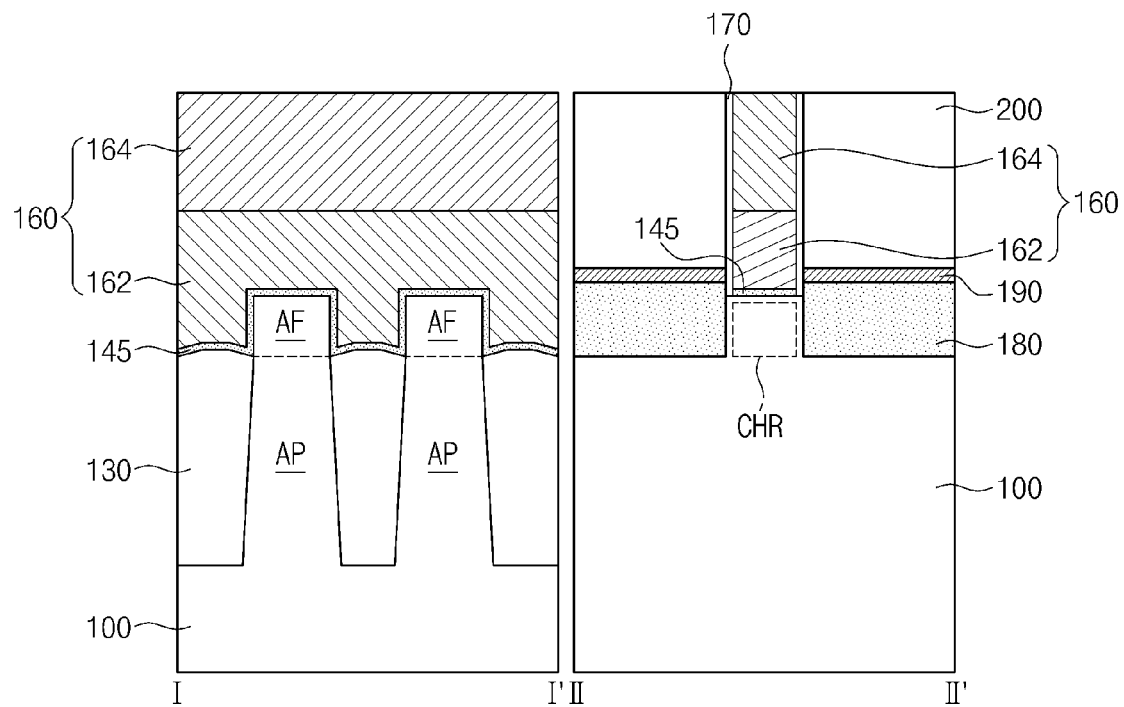

Referring to FIGS. 1, 9A, and 9B, silicide patterns 190 may be formed to cover the exposed surfaces of the source/drain electrodes 180 (S60). A lower interlayered insulating layer 200 may be formed on the silicide patterns 190.

In example embodiments, the silicide patterns 190 may be formed according to a self-aligned silicidation process. For example, the formation of the silicide patterns 190 may include forming a metal layer on the structure provided with the source/drain electrodes 180, reacting the metal layer with the source/drain electrodes 180, and removing an unreacted portion of the metal layer. The silicide patterns 190 may be at least one of nickel silicide, cobalt silicide, tungsten silicide, titanium silicide, niobium silicide, or tantalum silicide.

The formation of the lower interlayered insulating layer 200 may include forming an insulating layer on the structure provided with the silicide patterns 190, and then etching the insulating layer to expose a top surface of the sacrificial gate pattern 160. The lower interlayered insulating layer 200 may include at least one of a silicon oxide layer, a silicon nitride layer, a silicon oxynitride layer, or low-k dielectrics.

Figure 10A:
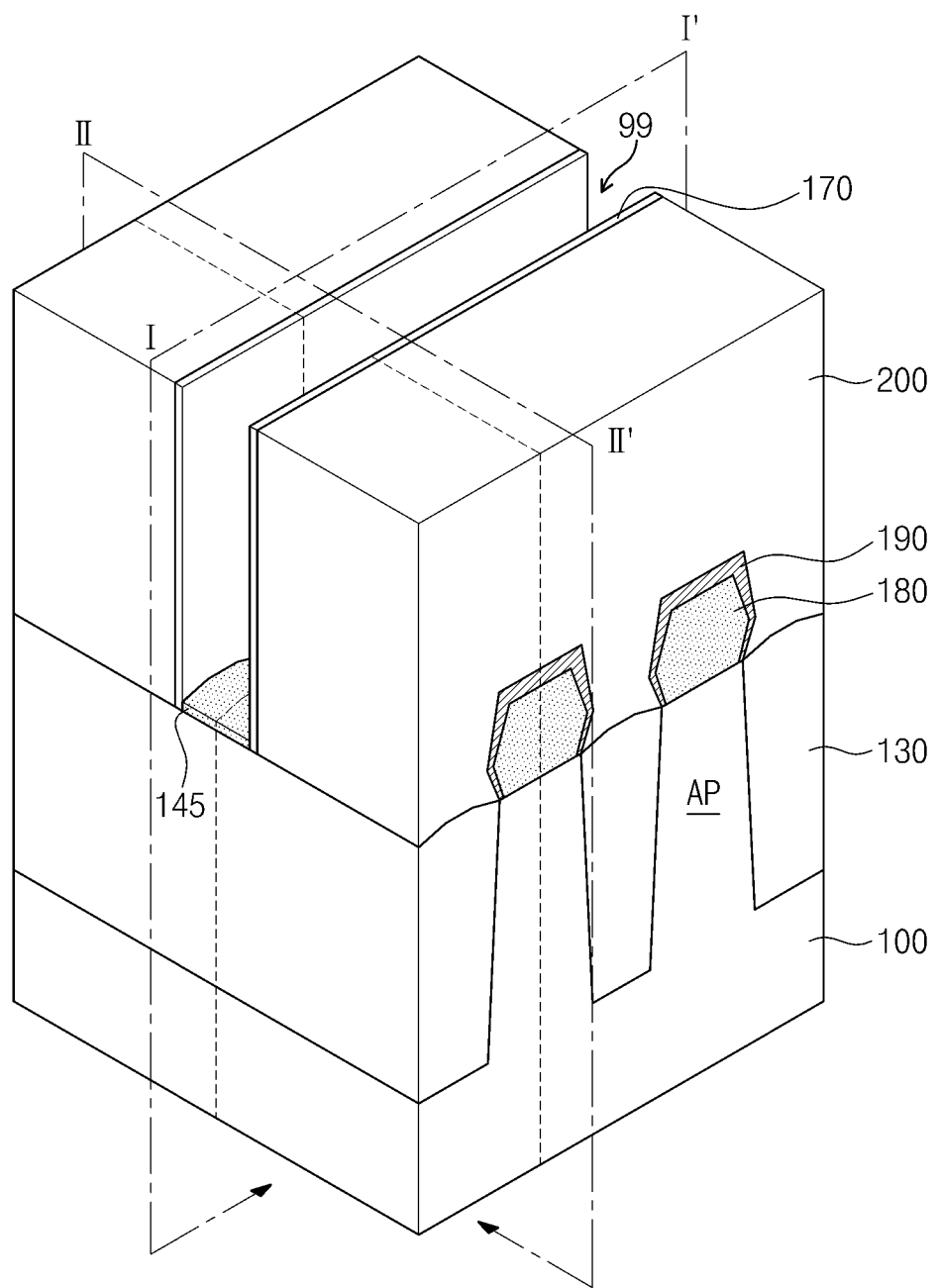
Figure 10B:
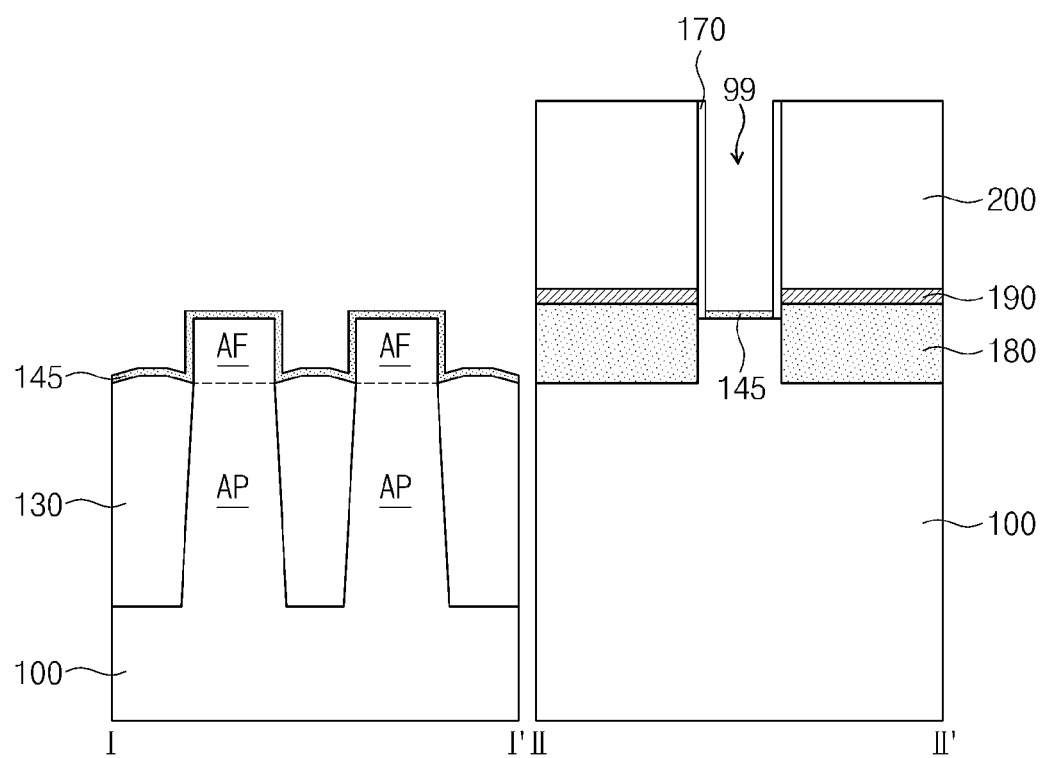

Referring to FIG. 10A and FIG. 10B, the sacrificial gate pattern 160 may be removed to form a gap region 99 that exposes a top surface of the gate insulating pattern 145 between the gate spacers 170.

The formation of the gap region 99 may include sequentially etching the second and first sacrificial patterns 164 and 162 using an etch recipe having etch selectivity with respect to the gate spacers 170, the lower interlayered insulating layer 200, and the gate insulating pattern 145.

Figure 11A:
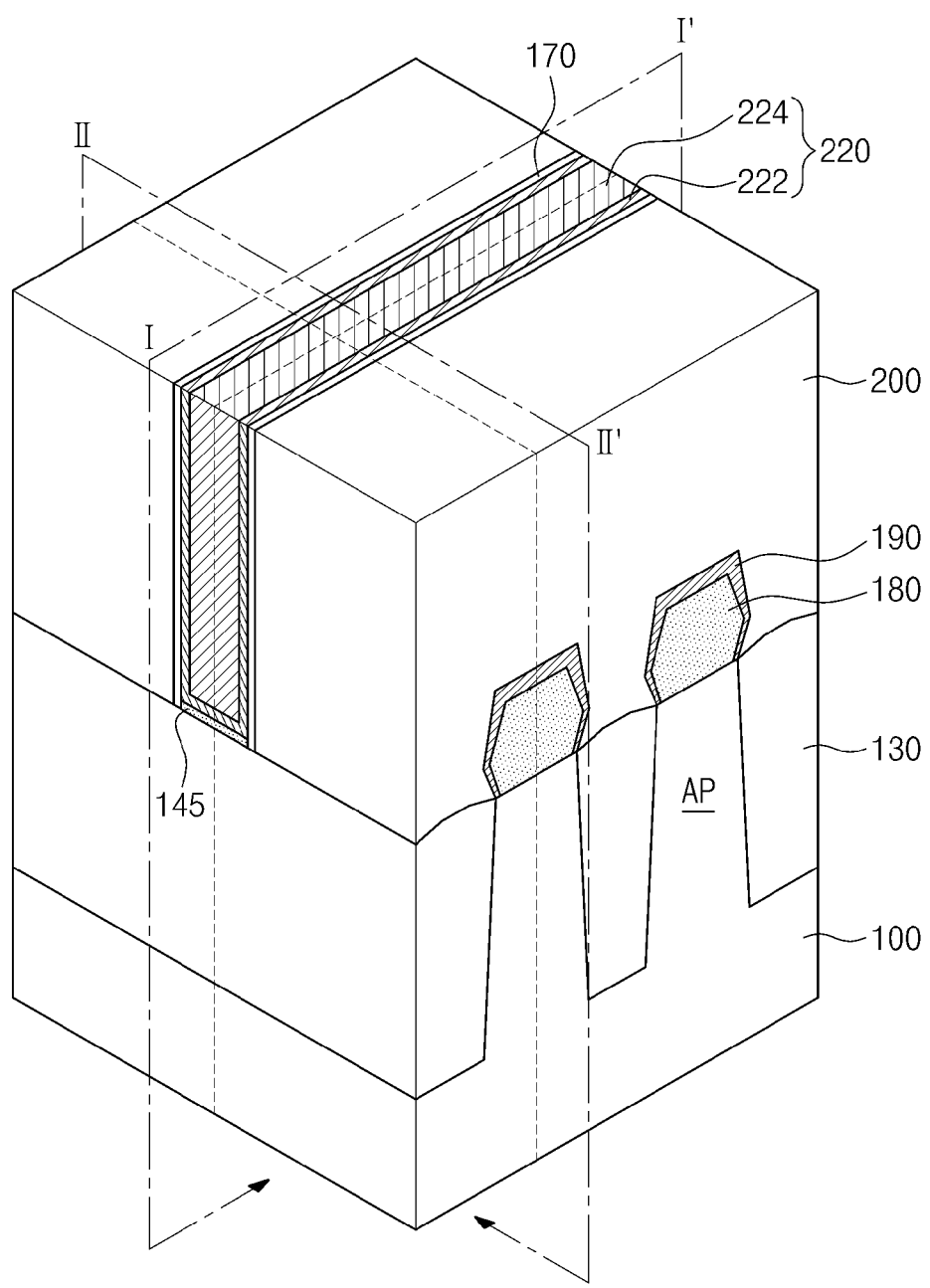
Figure 11B:
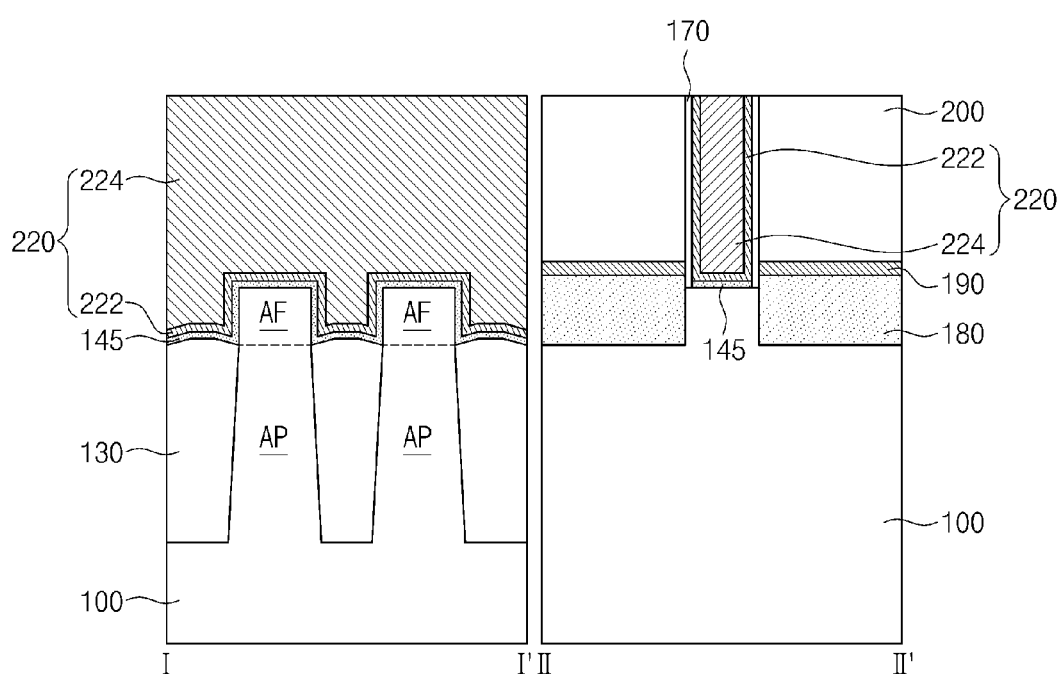

Referring to FIG. 1, FIG. 11A and FIG. 11B, a gate electrode 220 may be formed to fill the gap region 99 (S70).

In example embodiments, the gate electrode 220 may be formed to cover directly a top surface of the gate insulating pattern 145 and include a first gate electrode 222 and a second gate electrode 224 sequentially filling the gap region 99.

The first gate electrode 222 may be formed of a conductive material, whose work-function is selected to control a threshold voltage of the channel region CHR below the gate insulating pattern 145. In some embodiments, the first gate electrode 222 is formed one of metal nitrides. For example, the first gate electrode 222 may be formed of titanium nitride or tantalum nitride.

The second gate electrode 224 may be formed one of materials, whose electric resistivity may be lower than that of the first gate electrode 222. In some embodiments, the second gate electrode 224 is formed of one or more metals, for example, aluminum or tungsten.

In the case where the semiconductor device is provided to realize a CMOS device, the formation of the gate electrode 220 may include forming gate electrodes of NMOSFETs and forming gate electrodes of PMOSFETs, which may be performed independently each other. However, example embodiments of the inventive concept may not be limited to the embodiments, in which the gate electrodes of NMOSFETs and PMOSFETs are formed independently.

Figure 12A:
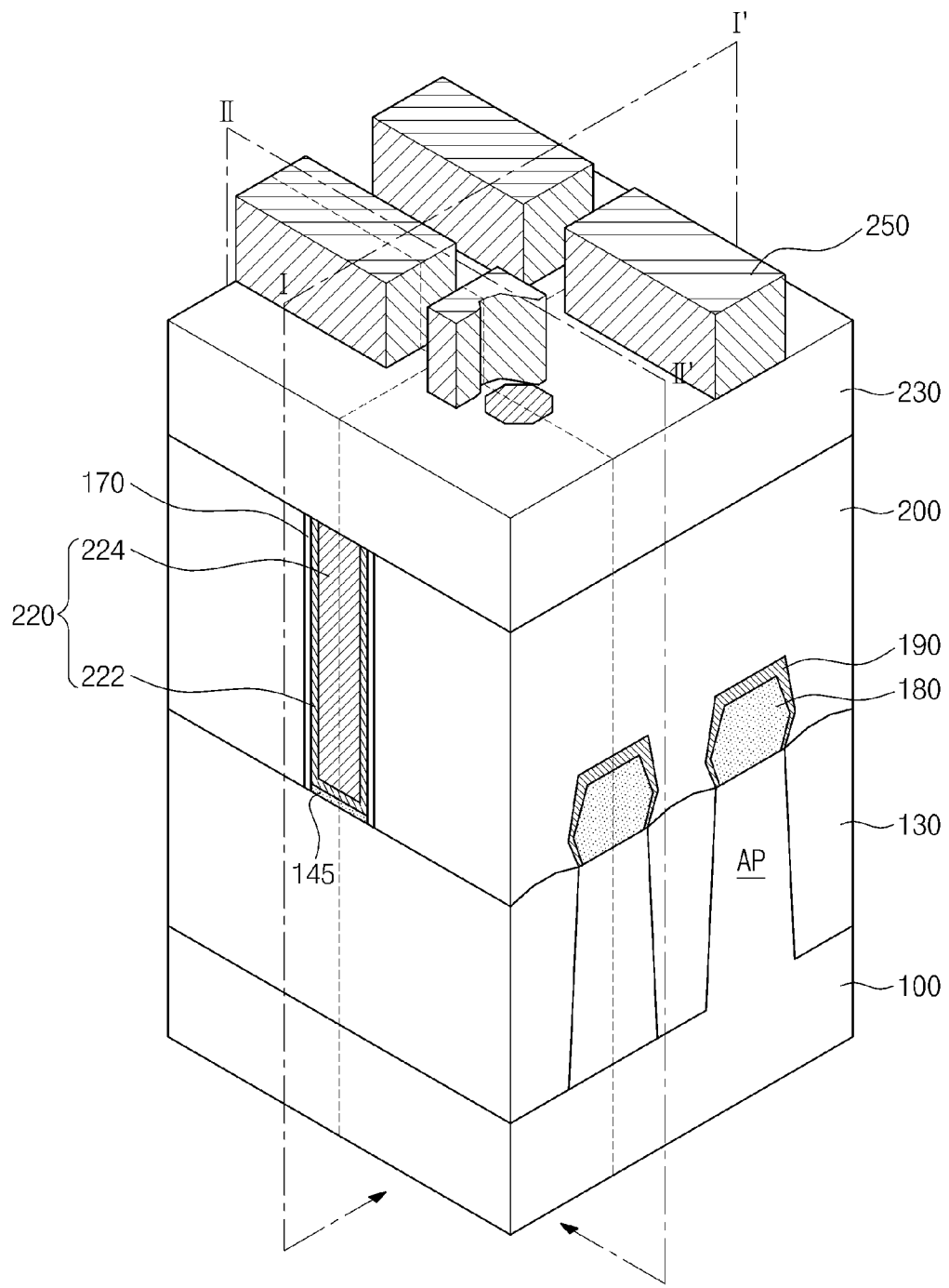
Figure 12B:
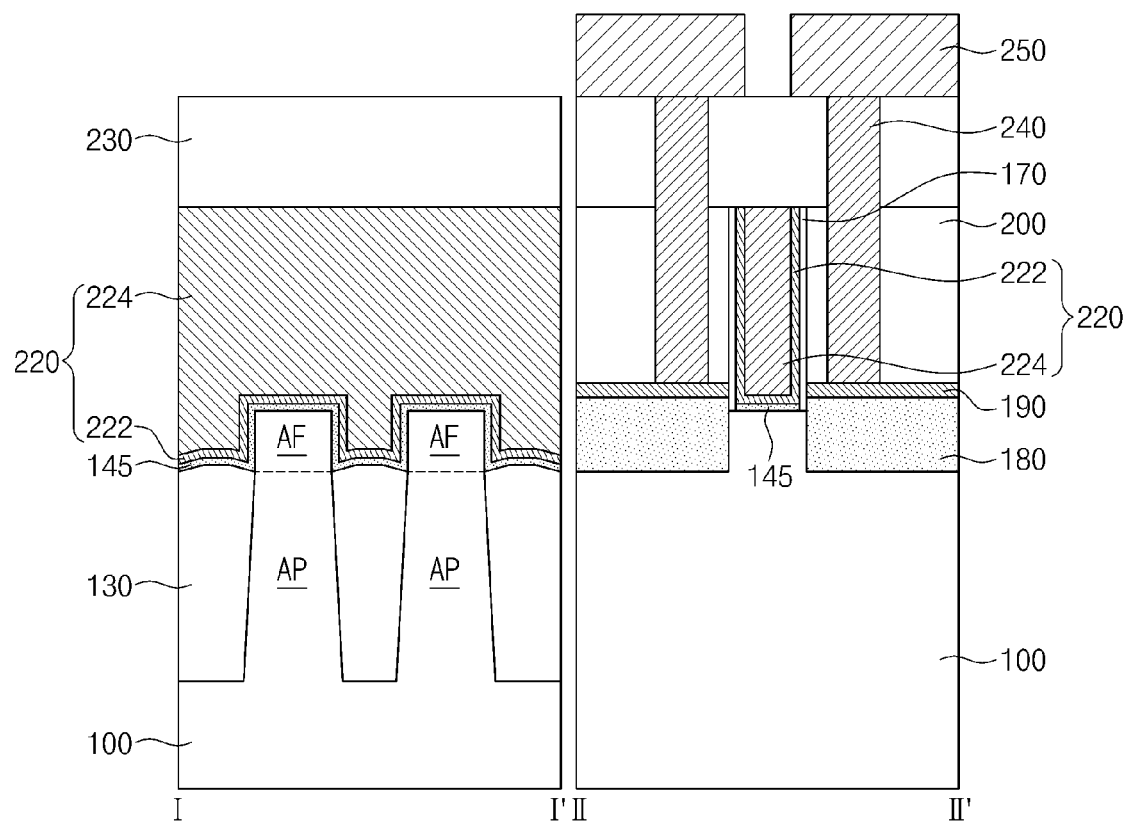

Referring to FIG. 1, FIG. 12A and FIG. 12B, an interconnection structure may be connected to the source/drain electrodes 180 via the silicide patterns 190 (S80). The formation of the interconnection structure may include forming an upper interlayered insulating layer 230 to cover the structure provided with the gate electrode 220, thereby forming contact holes to expose the silicide patterns 190 through the upper and lower interlayered insulating layers 230 and 200. The formation of the interconnection structure may further include forming contact plugs 240 to fill the contact holes, and forming interconnection lines 250 connected to the contact plugs 240 on the upper interlayered insulating layer 230.

Figure 14:
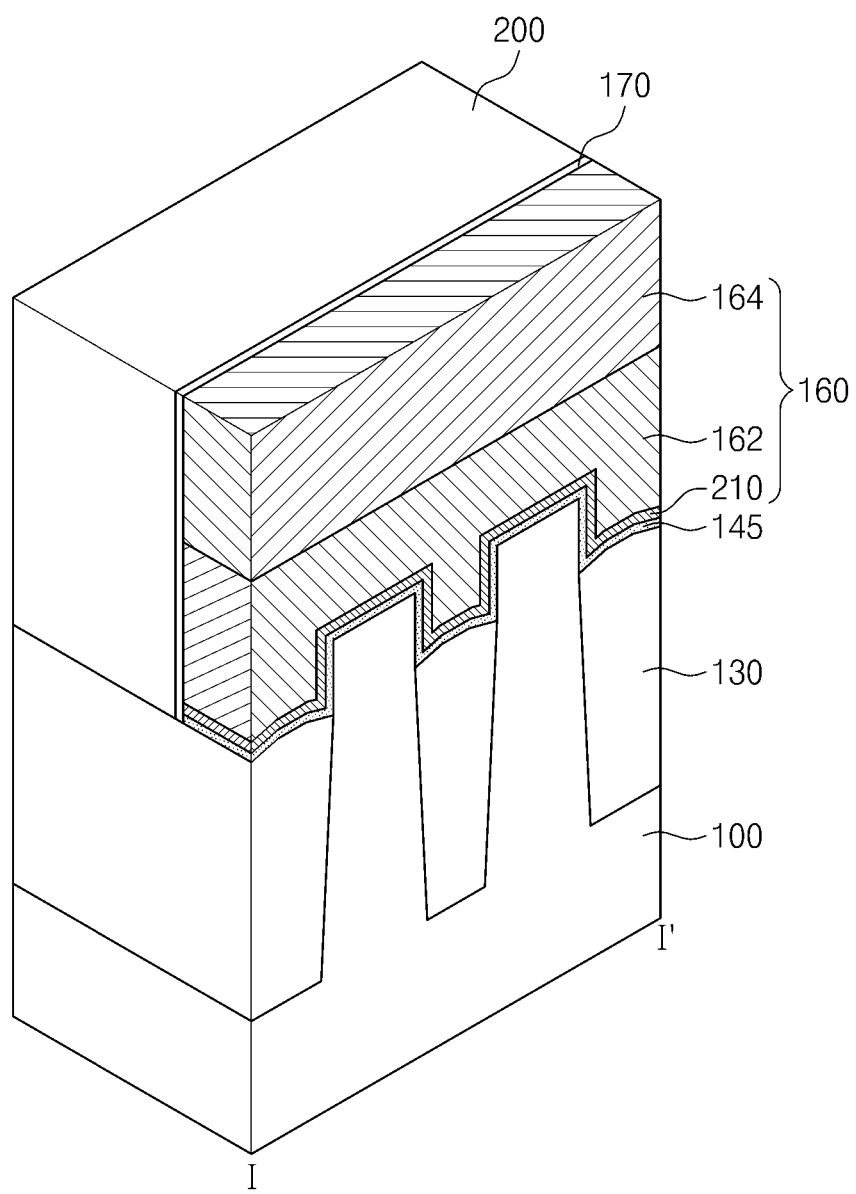
FIG. 14 is a perspective view illustrating a method of fabricating a semiconductor device according to other embodiments of the inventive concepts.

FIG. 13 is a perspective view exemplarily illustrating a method of fabricating a semiconductor device according to some modifications of the example embodiments of the inventive concepts. FIG. 14 is a perspective view exemplarily illustrating a method of fabricating a semiconductor device according to other modifications of the example embodiments of the inventive concept. Overlapping description of elements previously described with reference to FIGS. 2A through 12A may not be described in detail for reasons related to brevity.

According to a modification of the embodiments of the inventive concept, the exposed surfaces of the source/drain regions SDR may be additionally etched during or after the formation of the sacrificial gate pattern 160. Then, as shown in FIG. 13, upper edges of the source/drain regions SDR may be etched, such that the source/drain region SDR may have a tapered structure whose width decreases upward. Due to the tapered structure of the source/drain region SDR, it is possible to remove effectively the gate spacer layer from the source/drain regions SDR.

Furthermore, the device isolation pattern 130 near the source/drain region SDR may be recessed during the additional etching step. Accordingly, the device isolation pattern 130 near the source/drain region SDR may have a top surface lower than the device isolation pattern 130 under the gate insulating pattern 145.

According to other modifications of the example embodiments of the inventive concept, the sacrificial gate layer 150 (see FIGS. 5A and 5B) may further include an etch stop layer conformally covering a top surface of the gate insulating layer 140. As shown in FIG. 14, the sacrificial gate pattern 160 may include an etch stop pattern 210 interposed between the gate insulating pattern 145 and the first sacrificial pattern 162.

The etch stop pattern 210 may be formed of one or more materials selected to have a low etch rate with respect to an etch recipe for removing the first and second sacrificial patterns 162 and 164. For example, the etch stop pattern 210 may be formed of a material having an etch selectivity with respect to the first and second sacrificial patterns 162 and 164. Due to the etch selectivity of the etch stop pattern 210, it is possible to prevent the gate insulating pattern 145 from being damaged during the removal of the first and second sacrificial patterns 162 and 164.

Furthermore, the etch stop pattern 210 may be formed of a material, which can be selectively removed without an etch damage to the gate insulating pattern 145. For example, a material for the etch stop pattern 210 may be selected so the gate insulating pattern 145 can have an etch selectivity with respect to the etch stop pattern 210. Accordingly, during the removal of the etch stop pattern 210, it is possible to reduce a risk of damaging the gate insulating pattern 145.

Figure 15:
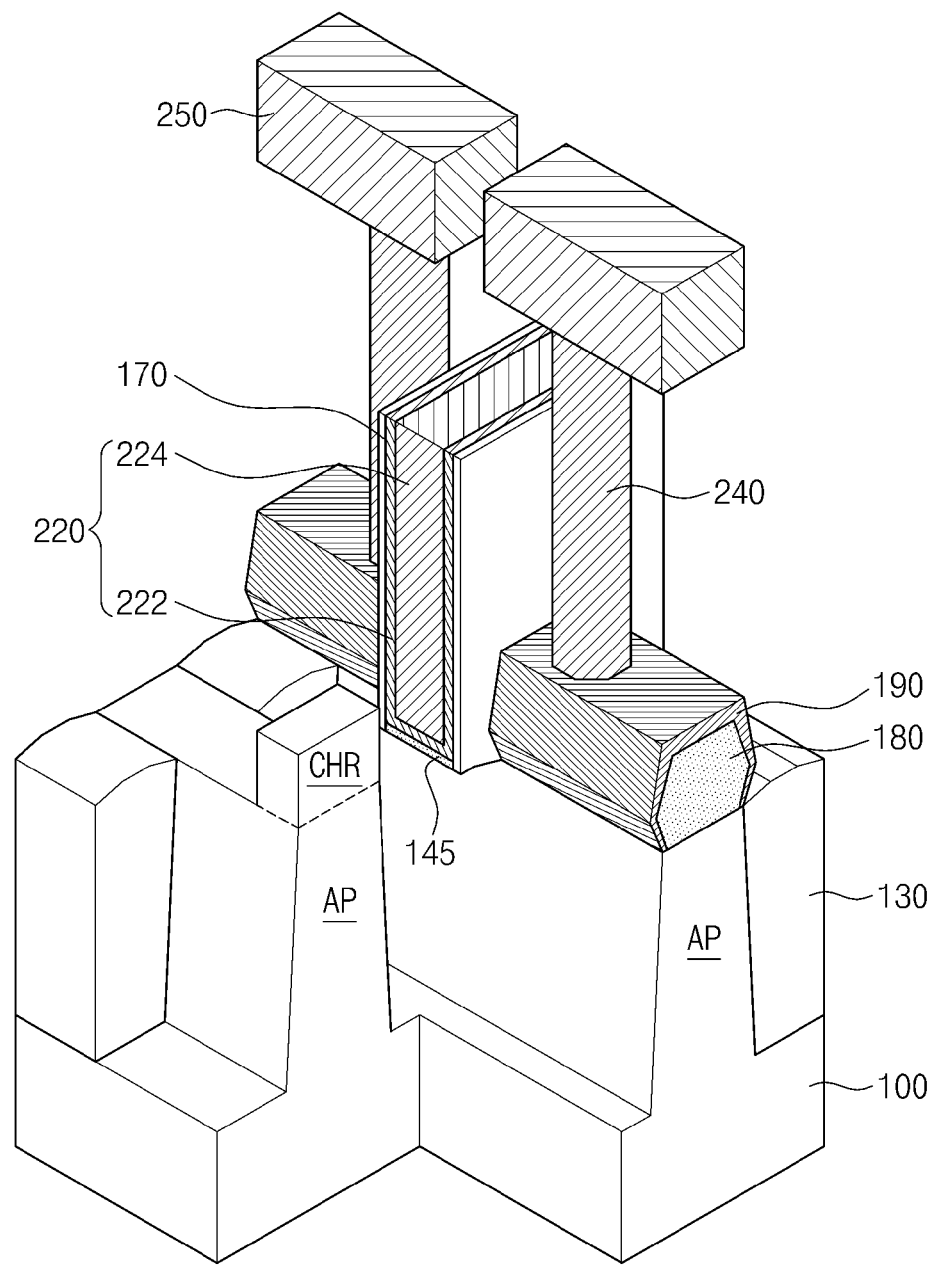
FIGS. 15 and 16 are perspective views illustrating structural features of a semiconductor device according to embodiments of the inventive concepts.
Figure 16:
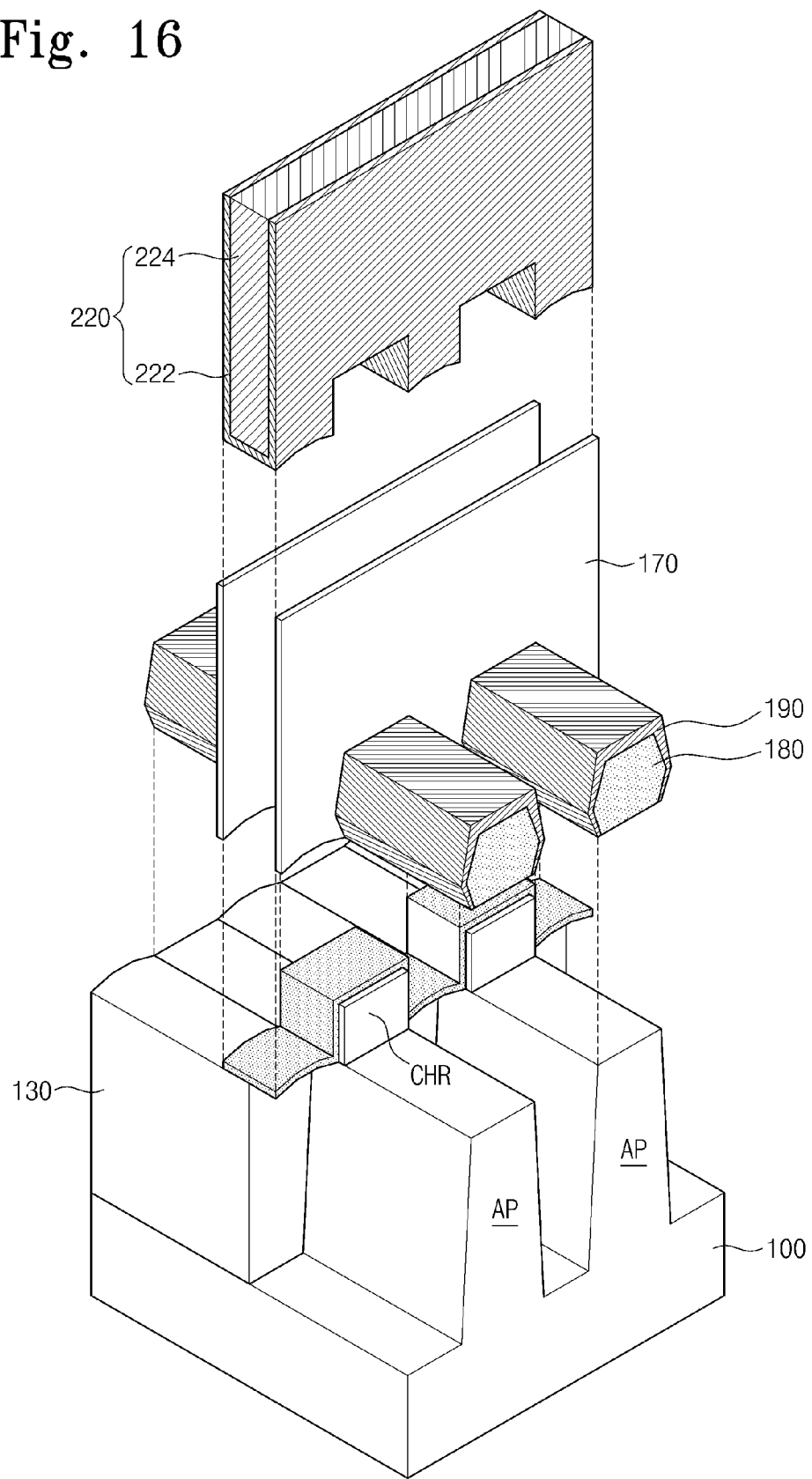

FIGS. 15 and 16 are perspective views exemplarily illustrating structural features of a semiconductor device according to embodiments of the inventive concepts. Overlapping description of features in the fabricating method previously described with reference to FIGS. 2A through 12A may not be described in detail for reasons related to brevity.

Referring to FIGS. 15 and 16, a gate electrode 220 may be provided on a substrate 100 to cross active patterns AP of the substrate 100. The substrate 100 may be in a form of a bulk silicon wafer or a SOI wafer. For the sake of simplicity, the description that follows refers to, but is not limited to, an embodiment in which the substrate 100 is a bulk silicon wafer.

Each of the active patterns AP may include a channel region CHR provided below at least a portion of the gate electrode 220. The gate electrode 220 may be formed to face a top surface and both sidewalls of the channel region CHR. Source/drain electrodes 180, which may be epitaxially grown from the active pattern AP, may be provided at both sides of the gate electrode 220, and silicide patterns 190 may be formed on the source/drain electrodes 180. Contact plugs 240 may be adjacent the gate electrode 220 and be coupled to the silicide patterns 190, and interconnection lines 250 may be provided on the gate electrode 220 and be coupled to the contact plugs 240.

The channel region CHR may have a top surface that is higher in a vertical direction than bottom surfaces of the source/drain electrodes 180, respectively, and be positioned in a horizontal direction between the source/drain electrodes 180. Furthermore, the channel region CHR may be different from the source/drain electrodes 180 in terms of crystal structure or lattice constant. The source/drain electrodes 180 may apply a tensile or compressive strain to the channel region CHR, due to the relative arrangement and the difference in crystal structure between the channel region CHR and the source/drain electrodes 180. The presence of the tensile or compressive strain may be utilized to improve performance of transistors (for example, mobility).

In example embodiments, the source/drain electrodes 180 may be configured to apply a tensile strain and a compressive strain for a PMOSFET. For example, the source/drain electrodes 180 may be formed of, but not limited to, silicon carbide (SiC) for NMOSFET and of silicon germanium (SiGe) for PMOSFET.

A gate insulating pattern 145 may be interposed between the gate electrode 220 and the channel region CHR. The gate insulating pattern 145 may include one or more high-k dielectric materials. For example, the gate insulating pattern 145 may be formed of, but not limited to, at least one of hafnium oxide, hafnium silicate, zirconium oxide, or zirconium silicate.

In an embodiment, the gate insulating pattern 145 extends horizontally from the channel region CHR to cover at least a portion of a top surface of the device isolation pattern 130. For example, a portion of the device isolation pattern 130 positioned between the gate electrodes 220 may have the top surface exposed by the gate insulating pattern 145.

The gate insulating pattern 145 may extend along a bottom surface of the gate electrode 220. According to embodiments of the inventive concepts, the gate insulating pattern 145 may be, however, formed to not cover a sidewall of the gate electrode 220. In some embodiments, the sidewall of the gate electrode 220 may be in direct contact with an insulating material having a dielectric constant smaller than the gate insulating pattern 145 or a silicon nitride layer. For example, a gate spacer 175 may be formed on a sidewall of the gate electrode 220 to separate electrically the gate electrode 220 from the source/drain electrode 180. In other embodiments, an insulating material, for example, spacer 170, having a dielectric constant of two or less is interposed between the gate electrode 220 and the source/drain electrode 180.

According to some aspects of the inventive concepts, in the case where the gate electrode 220 faces the sidewall of the channel region CHR, i.e., serving as a gate electrode of a Fin-FET structure, the gate electrode 220 may be thicker on the device isolation pattern 130 than on the channel region CHR. Due to this increase in thickness of the gate electrode 220, the sidewall of the gate electrode 220 may have an increased area, thereby causing a stronger capacitive coupling to occur between the gate electrode 220 and other neighboring conductive elements, for example, other gate electrodes or contact plugs. According to some embodiments of the inventive concepts, the gate insulating pattern 145 includes a high-k material and is provided not to cover the sidewall of the gate electrode 220. This feature reduce technical problems, such as delay or a disturbance of a signal passing through the gate electrode 220, which may be caused by a capacitive coupling that is linearly proportional to a dielectric constant of an insulating material between the gate electrode 220 and the neighboring conductive elements.

Figure 17:
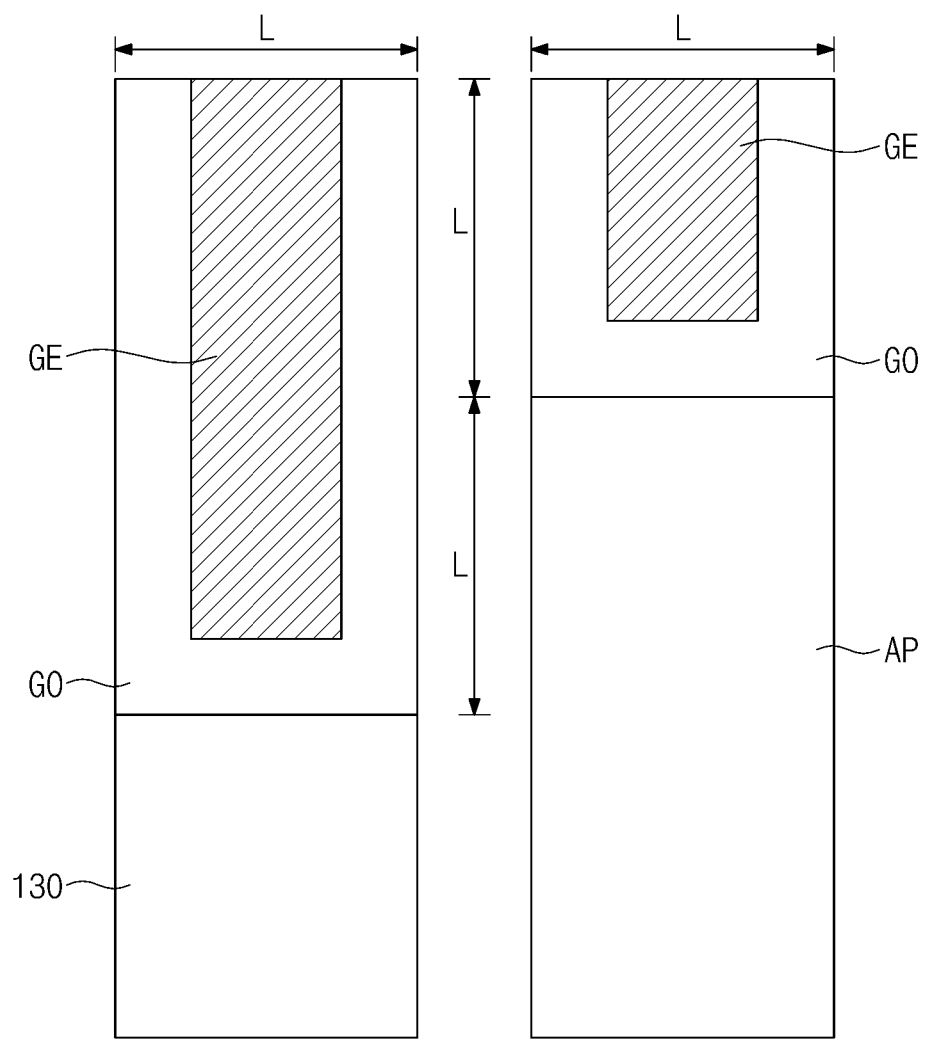
FIGS. 17 and 18 are schematic sectional views provided to describe some aspects of a semiconductor device according to embodiments of the inventive concepts.
Figure 18:
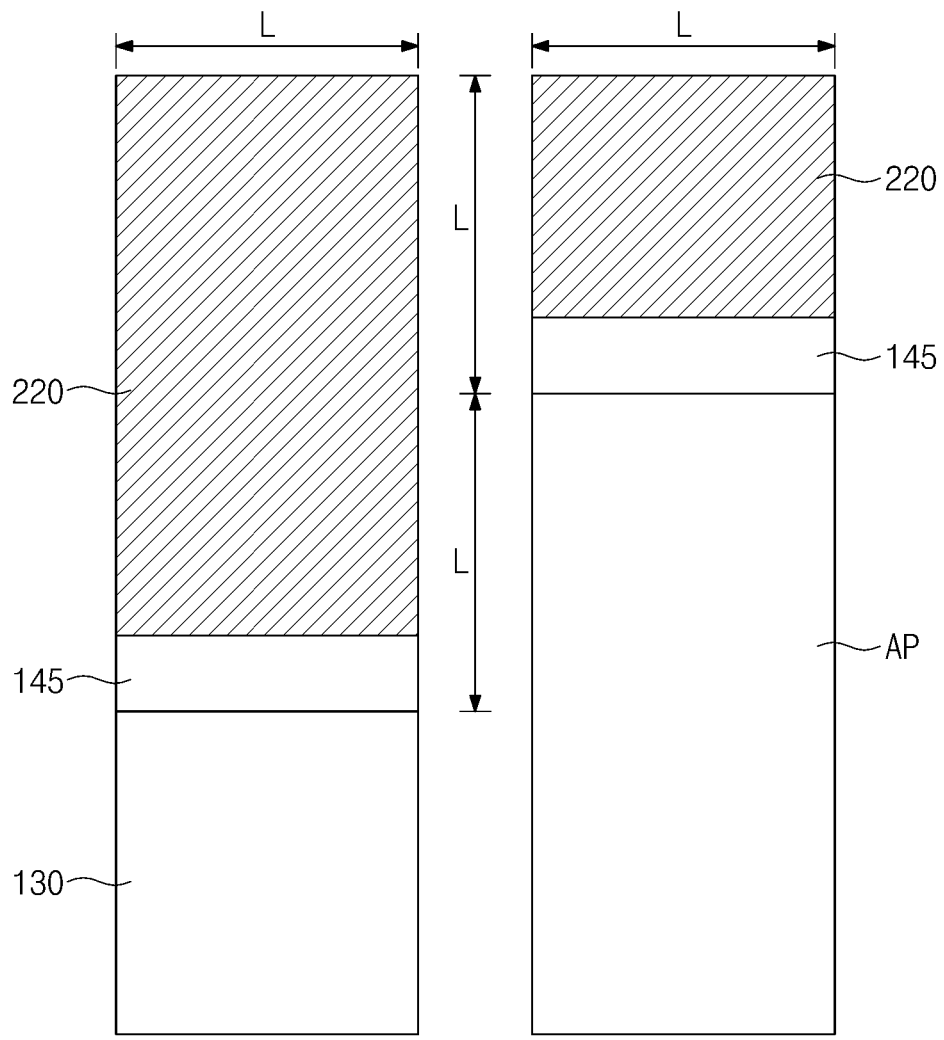

FIGS. 17 and 18 are schematic sectional views of semiconductor devices according to a comparative example and embodiments of the inventive concepts. In more detail, FIG. 17 shows a gate structure according to a comparative example, in which a gate oxide GO is formed to cover conformally the gap region 99 described with reference to FIG. 10A and FIG. 10B, while FIG. 18 shows a gate structure according to the embodiments of the inventive concept previously described with reference to FIGS. 2A through 12A. For reasons related to brevity, overlapping description of features in the fabricating method previously described with reference to FIGS. 2A through 12A are not described in further detail.

According to embodiments of the inventive concepts shown in FIG. 18, a sectional area of the gate electrode 220 or GE, regardless of position under consideration, is greater than that of the comparative example shown in FIG. 17. This increase in a sectional area of the gate electrode 220 or GE may make it possible to reduce an electric resistance of the gate electrode GE and to increase a delivering speed of gate signals.

Furthermore, the embodiments of the inventive concepts are superior beyond the comparative example of FIG. 17, with respect to a ratio R of a sectional area of the gate electrode GE to a total sectional area of the gate structure. Here, the gate structure can refer to a structure including the gate electrode GE or 220 and the gate oxide GO or 145. For example, for the comparative example shown in FIG. 17, the ratio R is 7/16 or 43.75% on the device isolation pattern 130 and 3/8 or 37.50% on the active pattern AP. By contrast, for the embodiment shown in FIG. 18, the ratio R is 7/8 or 87.50% on the device isolation pattern 130 and 3/4 or 75.00% on the active pattern AP. In other words, according to embodiments of the inventive concepts, the sectional area ratio R can be increased up to approximately two-fold compared with the example shown in FIG. 17.

By virtue of the increase in the sectional area ratio R, it is possible to reduce resistance of the gate electrode GE with ease. For example, if the sectional area ratio R is low as shown in FIG. 17, the gate electrode GE should have an increased height in order to realize a desired resistance value thereof. However, this increase in height of the gate electrode GE may lead to an increase in the capacitive coupling described with reference to FIGS. 15 and 16. In summary, embodiments of the inventive concepts realize a dielectric-metal gate Fin-FET without such technical difficulties.

Furthermore, since a thermal treatment is applied to the high-k dielectric layer before forming the silicide pattern 190, it is possible to prevent the silicide pattern 190 from being thermally damaged, even when the thermal treatment is performed at high temperatures. In addition, by virtue of the presence of the silicide pattern 190, the field effect transistor can be formed to have a decreased source-drain resistance.

Figure 19:
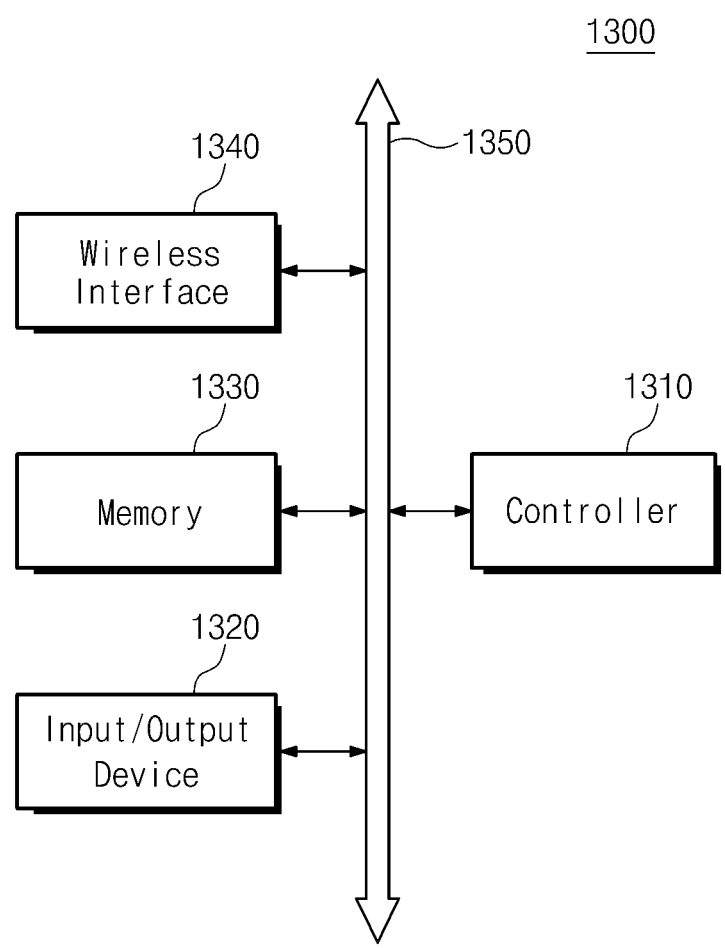
FIGS. 19 and 20 are block diagrams schematically illustrating electronic devices including a semiconductor device according to embodiments of inventive concepts.
Figure 20:
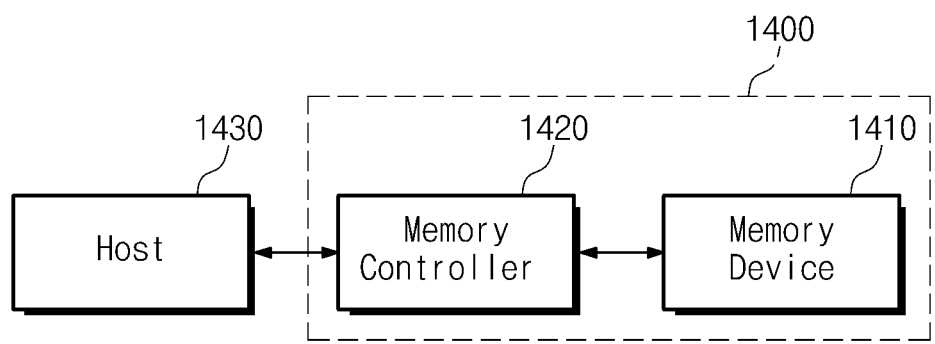

FIGS. 19 and 20 are block diagrams schematically illustrating electronic devices including a semiconductor device according to embodiments of inventive concepts.

Referring to FIG. 19, an electronic device 1300 including a semiconductor device according to embodiments of the inventive concepts may be used in one or more of a personal digital assistant (PDA), a laptop computer, a mobile computer, a web tablet, a wireless phone, a cell phone, a digital music player, a wire or wireless electronic device, or a complex electronic device. The electronic device 1300 may include a controller 1310, an input/output device 1320 such as a keypad, a keyboard, a display, a memory 1330, and a wireless interface 1340 that are combined to each other through a bus 1350. The controller 1310 may include, for example, at least one microprocessor, a digital signal process, a microcontroller or the like. The memory 1330 may be configured to store a command code to be used by the controller 1310 or a user data. The memory 1330 may include a semiconductor device according to example embodiments of inventive concepts. The electronic device 1300 may use a wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 20, a memory system including a semiconductor device according to embodiments of inventive concepts will be described. The memory system 1400 may include a memory device 1410 for storing huge amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430, e.g., a mobile device or a computer system, into a physical address of the memory device 1410. The memory device 1410 may be a semiconductor device according to embodiments of the inventive concepts.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor memory device according to one of the abovementioned embodiments is mounted may further include at least one semiconductor device, e.g., a controller and/or a logic device, that controls the semiconductor memory device.

According to embodiments of the inventive concepts, a silicide pattern can be formed on a source/drain electrode without any thermal damage. Accordingly, a field effect transistor can be fabricated to have a reduced source-drain resistance.

According to other embodiments of the inventive concepts, a high-k dielectric to be used as a gate insulating layer can be thermally treated without causing a thermal damage to the silicide pattern, which can improve electrical and structural properties of the gate insulating layer of the field effect transistor.

According to other embodiments of the inventive concepts, the gate insulating layer may be locally provided beneath a bottom surface of a gate electrode. This localization of the gate insulating layer enables the gate electrode to show an increase in effective sectional area or a reduction in electric resistance. Furthermore, the gate insulating layer formed of a high-k dielectric may be formed not to cover a sidewall of the gate electrode, which can reduce a capacitive coupling via the sidewall of the gate electrode.

While example embodiments of the inventive concepts have been particularly shown and described, it will be understood by one of ordinary skill in the art that variations in form and detail may be made therein without departing from the spirit and scope of the attached claims.

What is claimed is:

1. A field effect transistor, comprising:
    a substrate with an active pattern, the active pattern having a top surface and two sidewalls, the active pattern protruding from the substrate;
    a gate electrode proximal to the top surface and the sidewalls of the active pattern and crossing the active pattern;
    a gate spacer covering a sidewall of the gate electrode;
    a gate dielectric pattern at a bottom surface of the gate electrode;
    a source electrode on the active pattern at one side of the gate electrode;
    a drain electrode on the active pattern at another side of the gate electrode; and
    silicide patterns on surfaces of the source and drain electrodes, respectively,
    wherein the gate dielectric pattern includes at least one high-k layer and the gate spacer has a dielectric constant that is smaller than that of the gate dielectric pattern, and wherein the gate electrode comprises a first gate electrode and a second gate electrode, the first gate electrode extending from a region between the second gate electrode and the gate dielectric pattern to a region between a sidewall of the second gate electrode and the gate spacer.

2. The transistor of claim 1, wherein the active pattern comprises a channel region between the source and drain electrodes and below the gate electrode, and wherein the gate electrode comprises first portions facing both sidewalls of the channel region and a second portion provided on the channel region to connect the first portions with each other.

3. The transistor of claim 2, wherein the first portions are thicker than the second portion.

4. The transistor of claim 2, wherein the gate dielectric pattern is below the gate electrode and covers a bottom and side surfaces of the first portions and a bottom surface of the second portion, respectively.

5. The transistor of claim 2, wherein the substrate comprises an NMOS region and a PMOS region, and wherein the source and drain electrodes are configured to apply a tensile strain to a portion of the channel region in the NMQS region and to apply a compressive strain to a portion of the channel region in the PMOS region.

6. The transistor of claim 1, wherein the source and drain electrodes include a different material than the substrate.

7. The transistor of claim 1, wherein top surfaces of the source and drain electrodes are higher than the bottom surface of the gate electrode adjacent the source and drain electrodes, and wherein opposite side surfaces of the source and drain electrodes and the gate electrode are spaced apart from each other by a substantially uniform distance.

8. The transistor of claim 7, wherein the gate spacer fills a space between the opposite side surfaces of the source and drain electrodes and the gate electrode.

9. The transistor of claim 1, wherein the gate dielectric pattern is below the bottom surface of the gate electrode and has a substantially same width as a width of the gate electrode.

10. The transistor of claim 1, wherein a material interposed between the gate electrode and at least one of the source and drain electrodes has a dielectric constant that is smaller than or equivalent to a dielectric constant of a silicon nitride layer.

11. A field effect transistor, comprising:
a substrate with an active pattern, the active pattern having a top surface and two sidewalls, the active pattern protruding from the substrate;
a gate electrode on the top surface and the sidewalls of the active pattern;
a source electrode on the active pattern at one side of the gate electrode;
a drain electrode on the active pattern at another side of the gate electrode;
an insulating material between an inner sidewall of the gate electrode and at least one of the source electrode and the drain electrode; and
a high-k gate dielectric pattern at a bottom surface of the gate electrode, wherein the insulating material has a dielectric constant that is smaller than that of the gate dielectric pattern, wherein the gate electrode comprises a first gate electrode and a second gate electrode, the first gate electrode extending from a region between the second gate electrode and the gate dielectric pattern to a region between a sidewall of the second gate electrode and the gate spacer.

12. The transistor of claim 11, wherein the active pattern comprises a channel region between the source and drain electrodes and below the gate electrode, and wherein the gate electrode comprises first portions facing both sidewalls of the channel region and a second portion provided on the channel region to connect the first portions with each other.

13. The transistor of claim 12, wherein the substrate comprises an NMOS region and a PMOS region, and wherein the source and drain electrodes are configured to apply a tensile strain to a portion of the channel region in the NMOS region and to apply a compressive strain to a portion of the channel region in the PMOS region.

14. The transistor of claim 11, wherein top surfaces of the source and drain electrodes are higher than the bottom surface of the gate electrode adjacent the source and drain electrodes, and wherein opposite side surfaces of the source and drain electrodes and the gate electrode are spaced apart from each other by a substantially uniform distance.

15. The transistor of claim 11, wherein the gate dielectric pattern has a substantially same width as a width of the gate electrode.

16. The transistor of claim 11, wherein the insulating material has a dielectric constant that is smaller than or equivalent to a dielectric constant of a silicon nitride layer.

\* \* \* \* \*